United States Patent
Ferrant et al.

(10) Patent No.: US 7,085,153 B2
(45) Date of Patent: Aug. 1, 2006

(54) SEMICONDUCTOR MEMORY CELL, ARRAY, ARCHITECTURE AND DEVICE, AND METHOD OF OPERATING SAME

(75) Inventors: Richard Ferrant, Esquibien (FR); Serguei Okhonin, Lausanne (CH); Eric Carman, Cernex (FR); Michel Bron, Lausanne (CH)

(73) Assignee: Innovative Silicon S.A., Lausanne (CH)

( * ) Notice: Subject to any disclaimer, the term of this patent is extended or adjusted under 35 U.S.C. 154(b) by 59 days.

(21) Appl. No.: 10/829,877

(22) Filed: Apr. 22, 2004

(65) Prior Publication Data

US 2005/0013163 A1    Jan. 20, 2005

Related U.S. Application Data

(60) Provisional application No. 60/470,385, filed on May 13, 2003.

(51) Int. Cl.
    *G11C 11/24* (2006.01)
(52) U.S. Cl. .................. 365/149; 365/181; 365/190
(58) Field of Classification Search ............ 365/149 O, 365/190 X, 181 X
    See application file for complete search history.

(56) References Cited

U.S. PATENT DOCUMENTS

| | | | |
|---|---|---|---|
| 3,439,214 A | 4/1969 | Kabell | |
| 3,846,766 A | 11/1974 | Nojima et al. | |
| 3,997,799 A | 12/1976 | Baker | |
| 4,032,947 A | 6/1977 | Kesel et al. | |
| 4,193,128 A | * 3/1980 | Brewer | ........................ 365/228 |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |
| 4,791,610 A | 12/1988 | Takemae | |

(Continued)

FOREIGN PATENT DOCUMENTS

EP        0 030 856        6/1981

(Continued)

OTHER PUBLICATIONS

"A Capacitorless Double-Gate DRAM Cell", Kuo et al., IEEE Electron Device Letters, vol. 23, No. 6, Jun. 2002, pp. 345-347.

(Continued)

*Primary Examiner*—VanThu Nguyen
(74) *Attorney, Agent, or Firm*—Neil A. Steinberg

(57) ABSTRACT

There are many inventions described and illustrated herein. In a first aspect, the present invention is directed to a memory cell and technique of reading data from and writing data into that memory cell. In this regard, in one embodiment of this aspect of the invention, the memory cell includes two transistors which store complementary data states. That is, the two-transistor memory cell includes a first transistor that maintains a complementary state relative to the second transistor. As such, when programmed, one of the transistors of the memory cell stores a logic low (a binary "0") and the other transistor of the memory cell stores a logic high (a binary "1"). The data state of the two-transistor complementary memory cell may be read and/or determined by sampling, sensing measuring and/or detecting the polarity of the logic states stored in each transistor of complementary memory cell. That is, the two-transistor complementary memory cell is read by sampling, sensing measuring and/or detecting the difference in signals (current or voltage) stored in the two transistors.

41 Claims, 32 Drawing Sheets

U.S. PATENT DOCUMENTS

| | | | |
|---|---|---|---|
| 4,979,014 | A | 12/1990 | Hieda et al. |
| 5,144,390 | A | 9/1992 | Matloubian |
| 5,258,635 | A | 11/1993 | Nitayama et al. |
| 5,388,068 | A | 2/1995 | Ghoshal et al. |
| 5,422,846 | A | 6/1995 | Chang et al. |
| 5,446,299 | A | 8/1995 | Acovic et al. |
| 5,448,513 | A | 9/1995 | Hu et al. |
| 5,466,625 | A | 11/1995 | Hsieh et al. |
| 5,489,792 | A | 2/1996 | Hu et al. |
| 5,528,062 | A | 6/1996 | Hsieh et al. |
| 5,568,356 | A | 10/1996 | Schwartz |
| 5,593,912 | A | 1/1997 | Rajeevakumar |
| 5,606,188 | A | 2/1997 | Bronner et al. |
| 5,627,092 | A | 5/1997 | Alsmeier et al. |
| 5,631,186 | A | 5/1997 | Park et al. |
| 5,696,718 | A | 12/1997 | Hartmann |
| 5,740,099 | A | 4/1998 | Tanigawa |
| 5,778,243 | A | 7/1998 | Aipperspach et al. |
| 5,780,906 | A | 7/1998 | Wu et al. |
| 5,784,311 | A | 7/1998 | Assaderaghi et al. |
| 5,811,283 | A | 9/1998 | Sun |
| 5,877,978 | A | 3/1999 | Morishita et al. |
| 5,886,376 | A | 3/1999 | Acovic et al. |
| 5,886,385 | A | 3/1999 | Arisumi et al. |
| 5,897,351 | A | 4/1999 | Forbes |
| 5,929,479 | A | 7/1999 | Oyama |
| 5,930,648 | A | 7/1999 | Yang |
| 5,936,265 | A | 8/1999 | Koga |
| 5,939,745 | A | 8/1999 | Park et al. |
| 5,943,258 | A | 8/1999 | Houston et al. |
| 5,943,581 | A | 8/1999 | Lu et al. |
| 5,960,265 | A | 9/1999 | Acovic et al. |
| 5,968,840 | A | 10/1999 | Park et al. |
| 5,977,578 | A | 11/1999 | Tang |
| 5,982,003 | A | 11/1999 | Hu et al. |
| 6,018,172 | A | 1/2000 | Hidada et al. |
| 6,081,443 | A | 6/2000 | Morishita |
| 6,096,598 | A | 8/2000 | Furukawa et al. |
| 6,097,056 | A | 8/2000 | Hsu et al. |
| 6,111,778 | A | 8/2000 | MacDonald et al. |
| 6,121,077 | A | 9/2000 | Hu et al. |
| 6,157,216 | A | 12/2000 | Lattimore et al. |
| 6,171,923 | B1 | 1/2001 | Chi et al. |
| 6,177,300 | B1 | 1/2001 | Houston et al. |
| 6,177,708 | B1 | 1/2001 | Kuang et al. |
| 6,214,694 | B1 | 4/2001 | Leobandung et al. |
| 6,225,158 | B1 | 5/2001 | Furukawa et al. |
| 6,245,613 | B1 | 6/2001 | Hsu et al. |
| 6,252,281 | B1 | 6/2001 | Yamamoto et al. |
| 6,292,424 | B1 | 9/2001 | Ohsawa |
| 6,297,090 | B1 | 10/2001 | Kim |
| 6,300,649 | B1 | 10/2001 | Hu et al. |
| 6,320,227 | B1 | 11/2001 | Lee et al. |
| 6,333,532 | B1 | 12/2001 | Davari et al. |
| 6,350,653 | B1 | 2/2002 | Adkisson et al. |
| 6,351,426 | B1 | 2/2002 | Ohsawa |
| 6,359,802 | B1 | 3/2002 | Lu et al. |
| 6,384,445 | B1 | 5/2002 | Hidaka et al. |
| 6,391,658 | B1 | 5/2002 | Gates et al. |
| 6,403,435 | B1 | 6/2002 | Kang et al. |
| 6,421,269 | B1 | 7/2002 | Somasekhar et al. |
| 6,424,011 | B1 | 7/2002 | Assaderaghi et al. |
| 6,424,016 | B1 | 7/2002 | Houston |
| 6,429,477 | B1 | 8/2002 | Mandelman et al. |
| 6,440,872 | B1 | 8/2002 | Mandelman et al. |
| 6,441,435 | B1 | 8/2002 | Chan |
| 6,441,436 | B1 | 8/2002 | Wu et al. |
| 6,466,511 | B1 | 10/2002 | Fujita et al. |
| 6,492,211 | B1 | 12/2002 | Divakaruni et al. |
| 6,518,105 | B1 | 2/2003 | Yang et al. |
| 6,531,754 | B1 | 3/2003 | Nagano et al. |
| 6,538,916 | B1 | 3/2003 | Ohsawa |
| 6,544,837 | B1 | 4/2003 | Divakauni et al. |
| 6,548,848 | B1 | 4/2003 | Horiguchi et al. |
| 6,549,450 | B1 | 4/2003 | Hsu et al. |
| 6,552,398 | B1 | 4/2003 | Hsu et al. |
| 6,556,477 | B1 | 4/2003 | Hsu et al. |
| 6,566,177 | B1 | 5/2003 | Radens et al. |
| 6,567,330 | B1 | 5/2003 | Fujita et al. |
| 6,590,258 | B1 | 7/2003 | Divakauni et al. |
| 6,590,259 | B1 | 7/2003 | Adkisson et al. |
| 6,617,651 | B1 | 9/2003 | Ohsawa |
| 6,621,725 | B1 | 9/2003 | Ohsawa |
| 6,632,723 | B1 | 10/2003 | Watanabe et al. |
| 6,650,565 | B1 | 11/2003 | Ohsawa |
| 6,661,042 | B1 | 12/2003 | Hsu |
| 6,714,436 | B1 | 3/2004 | Burnett et al. |
| 6,721,222 | B1 | 4/2004 | Somasekhar et al. |
| 6,765,825 | B1 * | 7/2004 | Scott .................... 365/185.01 |
| 6,771,546 | B1 | 8/2004 | Ikehashi et al. |
| 6,778,424 | B1 | 8/2004 | Iwata et al. |
| 6,781,875 | B1 | 8/2004 | Ohsawa |
| 6,897,098 | B1 | 5/2005 | Hareland et al. |
| 6,909,151 | B1 | 6/2005 | Hareland et al. |
| 6,913,964 | B1 | 7/2005 | Hsu |
| 2001/0055859 | A1 | 12/2001 | Yamada et al. |
| 2002/0030214 | A1 | 3/2002 | Horiguchi |
| 2002/0034855 | A1 | 3/2002 | Horiguchi et al. |
| 2002/0036322 | A1 | 3/2002 | Divakauni et al. |
| 2002/0051378 | A1 | 5/2002 | Ohsawa |
| 2002/0064913 | A1 | 5/2002 | Adkisson et al. |
| 2002/0070411 | A1 | 6/2002 | Vermandel et al. |
| 2002/0072155 | A1 | 6/2002 | Liu et al. |
| 2002/0076880 | A1 | 6/2002 | Yamada et al. |
| 2002/0086463 | A1 | 7/2002 | Houston et al. |
| 2002/0089038 | A1 | 7/2002 | Ning |
| 2002/0098643 | A1 | 7/2002 | Kawanaka et al. |
| 2002/0110018 | A1 | 8/2002 | Ohsawa |
| 2002/0114191 | A1 | 8/2002 | Iwata et al. |
| 2002/0130341 | A1 | 9/2002 | Horiguchi et al. |
| 2002/0160581 | A1 | 10/2002 | Watanabe et al. |
| 2002/0180069 | A1 | 12/2002 | Houston |
| 2003/0003608 | A1 | 1/2003 | Arikado et al. |
| 2003/0015757 | A1 | 1/2003 | Ohsawa |
| 2003/0035324 | A1 | 2/2003 | Fujita et al. |
| 2003/0057487 | A1 | 3/2003 | Yamada et al. |
| 2003/0057490 | A1 | 3/2003 | Nagano et al. |
| 2003/0102497 | A1 | 6/2003 | Fried et al. |
| 2003/0112659 | A1 | 6/2003 | Ohsawa |
| 2003/0123279 | A1 | 7/2003 | Aipperspach et al. |
| 2003/0146488 | A1 | 8/2003 | Nagano et al. |
| 2003/0151112 | A1 | 8/2003 | Yamada et al. |
| 2003/0168677 | A1 | 9/2003 | Hsu |
| 2003/0213994 | A1 | 11/2003 | Hayashi et al. |
| 2004/0021137 | A1 | 2/2004 | Fazan et al. |
| 2004/0041206 | A1 | 3/2004 | Bhattacharyya |
| 2004/0041208 | A1 | 3/2004 | Bhattacharyya |
| 2004/0042268 | A1 | 3/2004 | Bhattacharyya |
| 2004/0052142 | A1 | 3/2004 | Ikehashi et al. |
| 2004/0108532 | A1 | 6/2004 | Forbes |
| 2005/0001269 | A1 | 1/2005 | Hayashi et al. |
| 2005/0062088 | A1 | 3/2005 | Houston |
| 2005/0064659 | A1 | 3/2005 | Willer |
| 2005/0135169 | A1 | 6/2005 | Somasekhar et al. |
| 2005/0141262 | A1 | 6/2005 | Yamada et al. |
| 2005/0141290 | A1 | 6/2005 | Tang et al. |
| 2005/0145886 | A1 | 7/2005 | Keshavarzi et al. |
| 2005/0145935 | A1 | 7/2005 | Keshavarzi et al. |
| 2005/0167751 | A1 | 8/2005 | Nakajima et al. |
| 2005/0189576 | A1 | 9/2005 | Ohsawa |

FOREIGN PATENT DOCUMENTS

| | | | |
|---|---|---|---|
| EP | 0 350 057 | B1 | 1/1990 |

| | | |
|---|---|---|
| EP | 0 354 348 A2 | 2/1990 |
| EP | 0 202 515 B1 | 3/1991 |
| EP | 0 207 619 B1 | 8/1991 |
| EP | 0 175 378 B1 | 11/1991 |
| EP | 0 253 631 B1 | 4/1992 |
| EP | 0 513 923 | 11/1992 |
| EP | 0 300 157 B1 | 5/1993 |
| EP | 0 564 204 A2 | 10/1993 |
| EP | 0 579 566 A2 | 1/1994 |
| EP | 0 362 961 | 2/1994 |
| EP | 0 599 506 A1 | 6/1994 |
| EP | 0 359 551 B1 | 12/1994 |
| EP | 0 366 882 B1 | 5/1995 |
| EP | 0 465 961 B1 | 8/1995 |
| EP | 0 694 977 | 1/1996 |
| EP | 0 333 426 B1 | 7/1996 |
| EP | 0 727 820 A1 | 8/1996 |
| EP | 0 739 097 A2 | 10/1996 |
| EP | 0 245 515 B1 | 4/1997 |
| EP | 0 788 165 A2 | 8/1997 |
| EP | 0 801 427 | 10/1997 |
| EP | 0 510 607 B1 | 2/1998 |
| EP | 0 537 677 B1 | 8/1998 |
| EP | 0 858 109 A2 | 8/1998 |
| EP | 0 860 878 A2 | 8/1998 |
| EP | 0 869 511 A2 | 10/1998 |
| EP | 0 878 804 | 11/1998 |
| EP | 0 920 059 A2 | 6/1999 |
| EP | 0 924 766 A2 | 6/1999 |
| EP | 0 642 173 B1 | 7/1999 |
| EP | 0 727 822 B1 | 8/1999 |
| EP | 0 933 820 A1 | 8/1999 |
| EP | 0 951 072 A1 | 10/1999 |
| EP | 0 971 360 A1 | 1/2000 |
| EP | 0 980 101 A2 | 2/2000 |
| EP | 0 601 590 B1 | 4/2000 |
| EP | 0 993 037 A2 | 4/2000 |
| EP | 0 836 194 B1 | 5/2000 |
| EP | 0 599 388 B1 | 8/2000 |
| EP | 0 689 252 B1 | 8/2000 |
| EP | 0 606 758 B1 | 9/2000 |
| EP | 0 682 370 B1 | 9/2000 |
| EP | 1 073 121 A2 | 1/2001 |
| EP | 0 726 601 B1 | 9/2001 |
| EP | 0 731 972 | 11/2001 |
| EP | 1 162 663 A2 | 12/2001 |
| EP | 1 162 744 A1 | 12/2001 |
| EP | 1 179 850 A2 | 2/2002 |
| EP | 1 180 799 | 2/2002 |
| EP | 1 191 596 A2 | 3/2002 |
| EP | 1 204 146 A1 | 5/2002 |
| EP | 1 204 147 A1 | 5/2002 |
| EP | 1 209 747 A2 | 5/2002 |
| EP | 0 744 772 B1 | 8/2002 |
| EP | 1 233 454 A2 | 8/2002 |
| EP | 0 725 402 B1 | 9/2002 |
| EP | 1 237 193 | 9/2002 |
| EP | 1 241 708 A2 | 9/2002 |
| EP | 1 253 634 A2 | 10/2002 |
| EP | 0 844 671 B1 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | 62-272561 | 11/1987 |
| JP | 02-294076 | 2/1991 |
| JP | 3-171768 | 7/1991 |
| JP | 8-213624 | 8/1996 |
| JP | 8-274277 | 10/1996 |
| JP | 9-046688 | 2/1997 |
| JP | 9-82912 | 3/1997 |
| JP | 10-242470 | 9/1998 |
| JP | 11-87649 | 3/1999 |
| JP | 2000-247735 | 8/2000 |
| JP | 2000-274221 | 9/2000 |
| JP | 2000-389106 | 12/2000 |
| JP | 2001-180633 | 6/2001 |
| JP | 2002-009081 | 1/2002 |
| JP | 2002394027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |

OTHER PUBLICATIONS

"A Capacitorless Double-Gate DRAM Cell for High Density Applications", Kuo et al., IEEE IEDM, 2002, pp. 843-946.

"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.

"The Multistable Charge-Controlled Memory Effect in SOI MOS Transistors at Low Temperatures", Tack et al., IEEE Transactions on Electron Devices, vol. 37, No. 5, May 1990, pp. 1373-1382.

"Mechanisums of Charge Modulation in the Floating Body of Triple-Well nMOSFET Capacitor-less DRAMs", Villaret et al., Proceedings of the INFOS 2003, Insulating Films on Semiconductors, 13th Bi-annual Conference, Jun. 18-20, 2003, Barcelona (Spain), (4 pages).

"A Memory Using One-Transistor Gain Cell on SOI (FBC) with Performance Suitable for Embedded DRAM's", Ohsawa et al., 2003 Symposium on VLSI Circuits Digest of Technical Papers, Jun. 2003 (4 pages).

FBC (Floating Body Cell) for Embedded DRAM on SOI, Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One-Transistor Gain Cell on SOI", Ohsawa et al., IEEE Journal of Solid-State Circuits, vol. 37, No. 11, Nov. 2002, pp. 1510-1522.

"Opposite Side Floating Gate SOI FLASH Memory Cell", Lin et al., IEEE, Mar. 2000, pp. 12-15.

"Advanced TFT SRAM Cell Technology Using a Phase-Shift Lithography", Yamanaka et al., IEEE Transactions on Electron Devices, vol. 42, No. 7, Jul. 1995, pp. 1305-1313.

"Soft-Error Characteristics in Bipolar Memory Cells with Small Critical Charge", Idei et al., IEEE Transactions on Electron Devices, vol. 38, No. 11, Nov. 1991, pp. 2465-2471.

"An SOI 4 Transistors Self-Refresh Ultra-Low-Voltage Memory Cell", Thomas et al., IEEE, Mar. 2003, pp. 401-404.

"Design of a SOI Memory Cell", Stanojevic et al., IEEE Proc. 21st International Conference on Microelectronics (MIEL '97), vol. 1, NIS, Yugoslavis, Sep. 14-17, 1997, pp. 297-300.

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"MOSFET Design Simplifies DRAM", P. Fazan, EE Times, May 14, 2002 (3 pages).

"One of Application of SOI Memory Cell—Memory Array", Lončar et al., IEEE Proc. 22nd International Conference on Microelectronics (MIEL 2000), vol. 2, NIŠ, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15µ m SOI DRAM", Terauchi et al., Proceedings 1996 IEEE International SOI Conference, Oct. 1996, pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei, IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"High-Performance Embedded SOI DRAM Architecture for the Low-Power Supply", Yamauchi et al., IEEE Journal of Solid-State Circuits, vol. 35, No. 8, Aug. 2000, pp. 1169-1178.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Hot-Carrier Effects in Thin-Film Fully Depleted SOI MOSFET's", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22.

"SOI MOSFET on Low Cost SPIMOX Substrate", Iyer et al., IEEE IEDM, Sep. 1998, pp. 1001-1004.

"Simulation of Floating Body Effect in SOI Circuits Using BSIM3SOI", Tu et al., Proceedings of Technical Papers (IEEE Cat No. 97TH 8303), pp. 339-342.

"High-Field Transport of Inversion-Layer Electrons and Holes Including Velocity Overshoot", Assaderaghi et al., IEEE Transactions on Electron Devices, vol. 44, No. 4, Apr. 1997, pp. 664-671.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.

"Hot-Carrier-Induced Degradation in Ultra-Thin-Film Fully-Depleted SOI MOSFETs", Yu et al., Solid-State Electronics, vol. 39, No. 12, 1996, pp. 1791-1794.

Hot-Carrier Effect in Ultra-Thin-Film (UTF) Fully-Depleted SOI MOSFET's, Yu et al., 54th Annual Device Research Conference Digest (CAT. No. 96TH 8193), pp. 22-23.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE Electron Device Letters, vol. 15, No. 12, Dec. 1994, pp. 510-512.

"Dynamic Threshold-Voltage MOSFET (DTMOS) for Ultra-Low Voltage Operation" Assaderaghi et al., 1994 IEEE, IEDM 94, pp. 809-812.

"A Capacitorless DRAM Cell on SOI Substrate", Wann et al., IEEE IEDM 1993, pp. 635-638.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si—SiO₂ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure in SOI MOS Devices", Tack et al., Solid-State Electronics vol. 33, No. 3, 1990, pp. 357-364.

"A Long Data Retention SOI DRAM with the Body Refresh Function", Tomishima et al., IEICE Trans. Electron., vol. E80-C, No. 7, Jul. 1997, pp. 899-904.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Capacitor-Less 1-Transistor DRAM", Fazan et al., 2002 IEEE International SOI Conference, Oct. 2002, pp. 10-13.

"SOI (Silicon-on-Insulator) for High Speed Ultra Large Scale Integration", C. Hu, Jpn. J. Appl. Phys. vol. 33 (1994) pp. 365-369, Part 1, No. 1B, Jan. 1994.

"Source-Bias Dependent Charge Accumulation in P+ –Poly Gate SOI Dynamic Random Access Memory Cell Transistors", Sim et al., Jpn. J. Appl. Phys. vol. 37 (1998) pp. 1260-1263, Part 1, No. 3B, Mar. 1998.

"Suppression of Parasitic Bipolar Action in Ultra-Thin-Film Fully-Depleted CMOS/SIMOX Devices by Ar-Ion Implantation into Source/Drain Regions", Ohno et al., IEEE Transactions on ELectron Devices, vol. 45, No. 5, May 1998, pp. 1071-1076.

"Fully Isolated Lateral Bipolar-MOS Transistors Fabricated in Zone-Melting-Recrystallized Si Films on $SiO_2$", Tsaur et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's in Small-Grain LPCVD Polycrystalline Silicon", Malhi et al., IEEE Transactions on Electron Devices, vol. ED-32, No. 2, Feb. 1985, pp. 258-281.

"Triple-Wel nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).

"Mechanism of Charge Modulation in the Floating Body of Triple-Well NMOSFET Capacitor-less DRAMs", Villaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"DRAM Design Using the Taper-Isolated Dynamic RAM Cell, Leiss et al., ", IEEE Transactions on Electron Devices, vol. ED-29, No. 4, Apr. 1982, pp. 707-714

"SOI MOSFET Design for All-Dimensional Scaling with Short Channel, Narrow Width and Ultra-Thin Films", Chan et al., IEEE IEDM, 1995, pp. 631-634.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE Electron Device Letters, vol. 15, No. 12, Dec. 1994, pp. 510-512.

"Dynamic Threshold-Voltage MOSFET (DTMOS) for Ultra-Low Voltage Operation", Assaderaghi et al., 1994 EEE, IEDM 194, pp. 809-812.

"A Capacitorless DRAM Cell on SOI Substrate", Wann et al., IEEE IEDM 1993, pp. 635-638.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si—$SiO_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure in SOI MOS Devices", Tack et al., Solid-State Electronics vol. 33, No. 3, 1990, pp. 357-364.

* cited by examiner

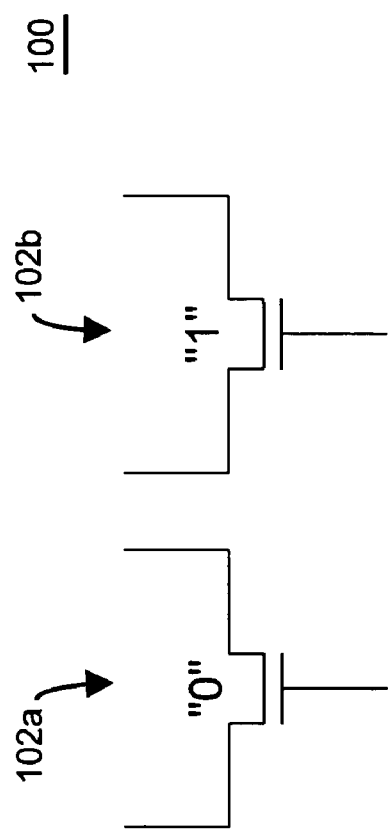
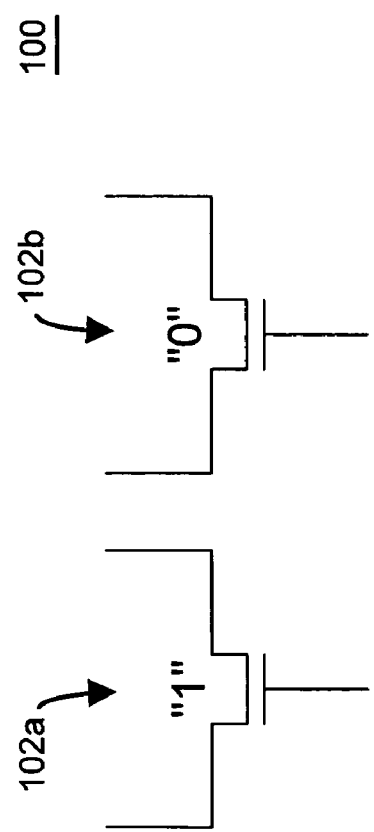

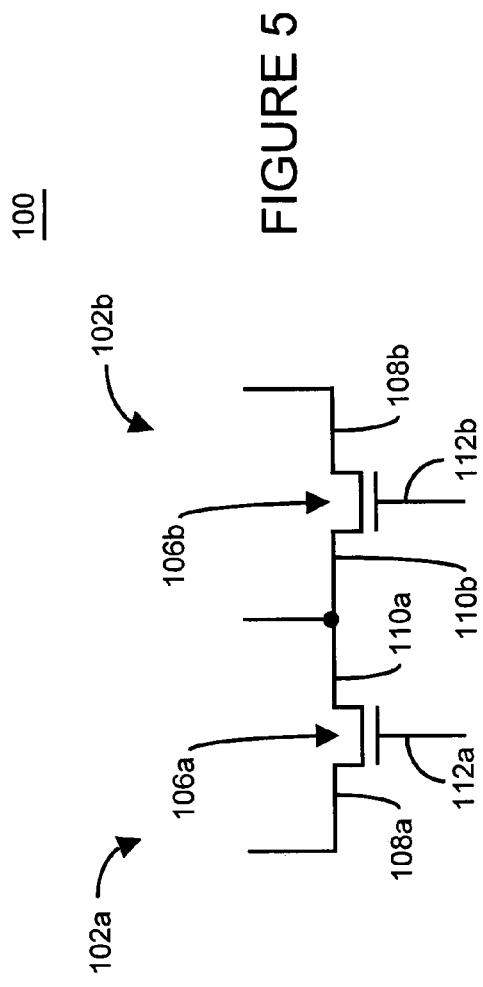
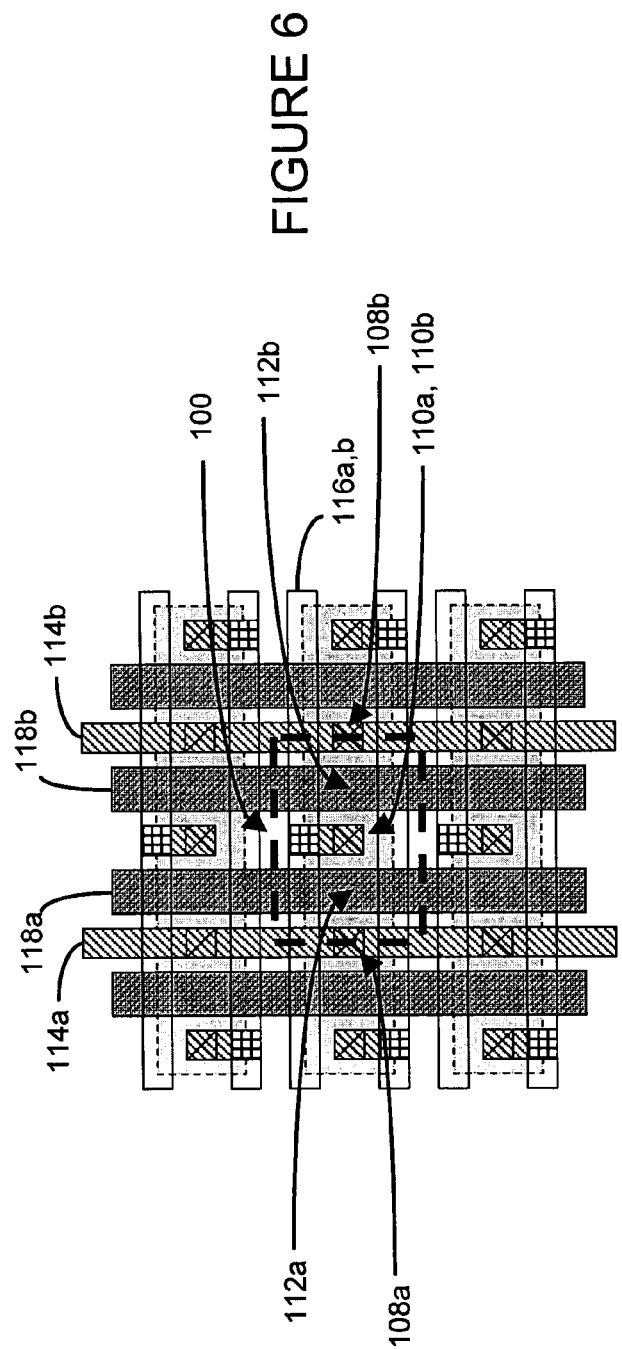

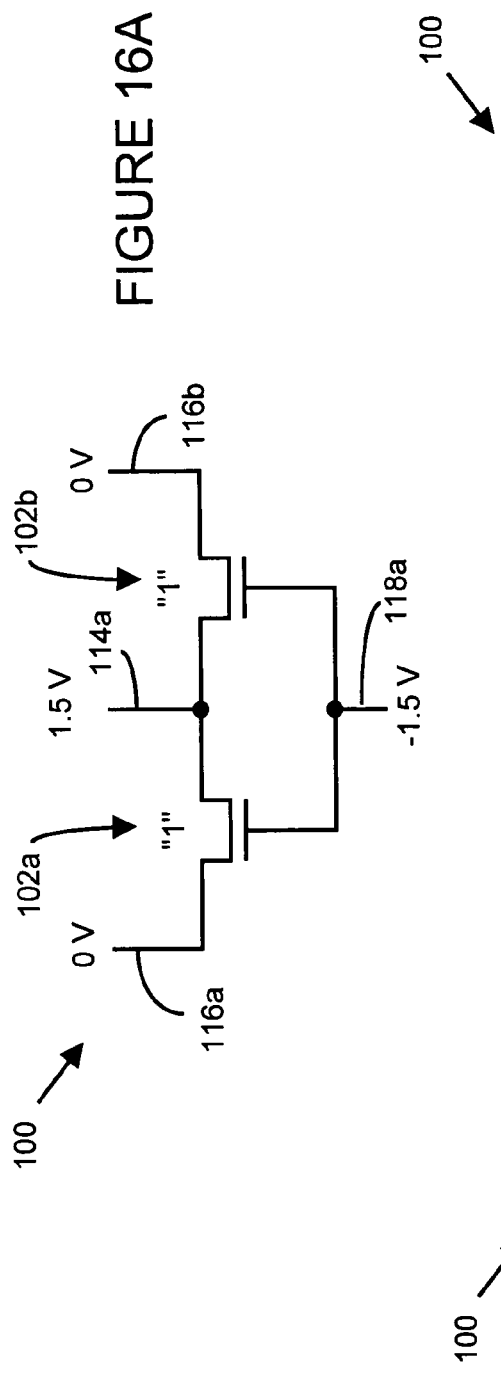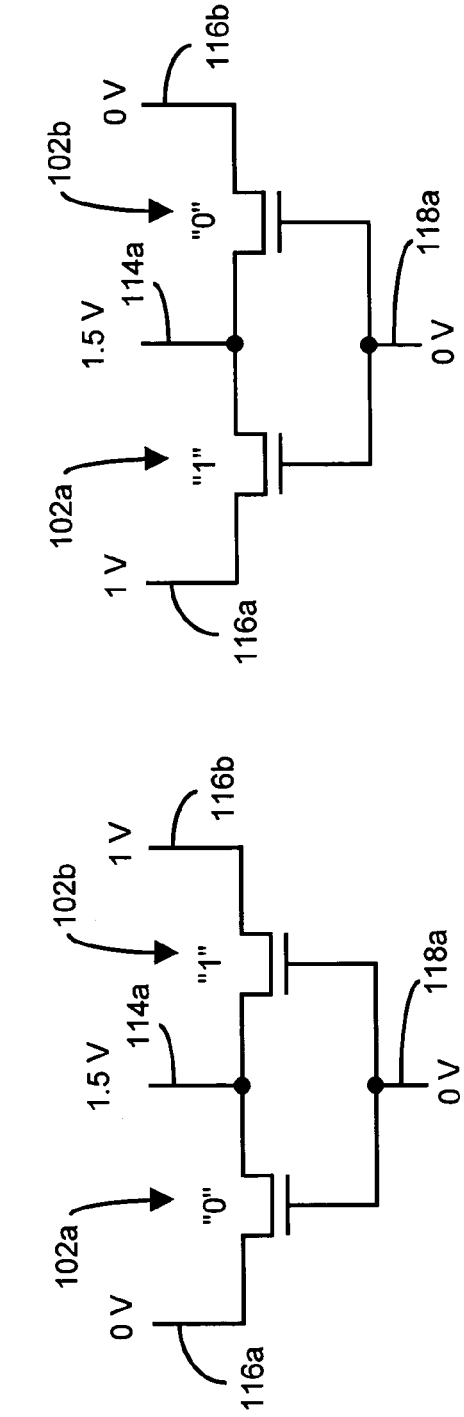

SEMICONDUCTOR MEMORY CELL, ARRAY, ARCHITECTURE AND DEVICE, AND METHOD OF OPERATING SAME

CROSS-REFERENCE TO RELATED APPLICATIONS

This application claims priority to: U.S. Provisional Application Ser. No. 60/470,385, entitled "Two Transistor Gain Cell", filed May 13, 2003 (hereinafter "the Provisional Application"). The contents of the Provisional Application are incorporated by reference herein in their entirety.

BACKGROUND

This invention relates to a semiconductor memory cell, array, architecture and device, and techniques for controlling and/or operating such cell and device; and more particularly, in one aspect, to a semiconductor dynamic random access memory ("DRAM") cell, array, architecture and/or device wherein the memory cell includes an electrically floating body in which an electrical charge is stored.

There are many different types and/or forms of DRAM cells, including, for example, a semiconductor memory cell consisting of an access transistor and a capacitor, which stores an electric charge representing a bi-stable memory state. The access transistor serves as a switch for controlling the charging and discharging of the capacitor as well as reading and writing of the logic states into the capacitor (i.e., charging or discharging the capacitor).

Although significant integration densities can be achieved with DRAM devices employing one transistor-one capacitor memory cells, such devices tend to be limited or restricted with respect to the size of the memory cell. In this regard, conventional techniques employ stacked and/or trench capacitor approaches, whereby the capacitor is partially disposed above and/or below an access transistor.

In addition, DRAM devices employing one transistor-one capacitor memory cells tend to be fabricated using manufacturing processes that are different from and/or incompatible with manufacturing processes for logic devices (for example, microprocessors). As a result, integration of one transistor-one capacitor memory cells into logic devices is often complicated and expensive.

Another type of dynamic random access memory cell is described and illustrated in non-provisional patent application entitled "Semiconductor Memory Device", which was filed on Jun. 10, 2003 and assigned Ser. No. 10/450,238 (hereinafter "Semiconductor Memory Device Patent Application"). With reference to FIGS. 1A and 1B, the Semiconductor Memory Device Patent Application discloses, among other things, semiconductor DRAM device 10 in which each memory cell 12 consists of transistor 14 having gate 16, body region 18, which is electrically floating, source region 20 and drain region 22. The body region 18 is disposed between and adjacent to source region 20 and drain region 22. Data is written into or read from a selected memory cell by applying suitable control signals to a selected word line(s) 24, a selected source line(s) 26 and/or a selected bit line(s) 28. In response, charge carriers are accumulated in or emitted and/or ejected from electrically floating body region 18 wherein the data states are defined by the amount of carriers within electrically floating body region 18. Notably, the entire contents of the Semiconductor Memory Device Patent Application, including, for example, the features, attributes, architectures, configurations, materials, techniques and advantages described and illustrated therein, are incorporated by reference herein.

In particular, in one embodiment, the memory cell of the Semiconductor Memory Device Patent Application operates by accumulating in or emitting/ejecting majority carriers (electrons or holes) 30 from body region 18 of, for example, N-channel transistors. (See, FIGS. 2A and 2B). In this regard, accumulating majority carriers (in this example, "holes") 30 in body region 18 of memory cells 12 via, for example, impact ionization near source region 20 and/or drain region 22, is representative of a logic high or "1" data state. (See, FIG. 2A). Emitting or ejecting majority carriers 30 from body region 18 via, for example, forward biasing the source/body junction and/or the drain/body junction, is representative of a logic low or "0". (See, FIG. 2B).

Several techniques may be implemented to read the data stored in (or write the data into) a memory device of the Semiconductor Memory Device Patent Application. For example, a current sense amplifier (not illustrated) may be employed to read the data stored in memory cells 12. In this regard, a current sense amplifier may compare the cell current to a reference current, for example, the current of a reference cell (not illustrated). From that comparison, it may be determined whether memory cell 12 contained a logic high (relatively more majority carries 30 contained within body region 18) or logic low data state (relatively less majority carries 28 contained within body region 18).

Notably, transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable.

SUMMARY OF THE INVENTION

There are many inventions described and illustrated herein. In a first principal aspect, the present invention is a semiconductor dynamic random access memory cell for storing a first data state and a second data state. The memory cell includes first and second transistors, wherein each transistor includes a source region, a drain region, an electrically floating body region disposed between and adjacent to the source region and the drain region, and a gate spaced apart from, and capacitively coupled to, the body region. In addition, each transistor includes a first state representative of a first charge in the body region, and a second data state representative of a second charge in the body region. Further the memory cell is in: (1) the first data state when the first transistor is in the first state and the second transistor is in the second state and (2) the second data state when the first transistor is in the second state and the second transistor is in the first state.

In one embodiment, the semiconductor dynamic random access memory cell includes two outputs including a first output connected to the drain region of the first transistor and a second output connected to the drain region of the second transistor. In this embodiment, the gate of the first transistor is connected to the gate of the second transistor, and the source region of the first transistor and the source region of the second transistor are the same region.

In another embodiment, the semiconductor dynamic random access memory cell includes two outputs including a first output connected to the source region of the first transistor and a second output connected to the source region of the second transistor. In this embodiment, the drain region of the first transistor and the drain region of the second transistor are the same region.

Notably, the memory cell may be programmed to a first data state by applying a first control signal to the gate of the first transistor and a second control signal to the gate of the second transistor and wherein the first and second control signals include different voltage amplitudes.

In another principal aspect, the present invention is a semiconductor memory array comprising a plurality of semiconductor dynamic random access memory cells arranged in a matrix of rows and columns. Each semiconductor dynamic random access memory cell includes first and second transistors. Each transistor includes a source region, a drain region, a electrically floating body region disposed between and adjacent to the source region and the drain region, and a gate spaced apart from, and capacitively coupled to, the body region. The transistors include a first state representative of a first charge in the body region; and a second data state representative of a second charge in the body region. Further each memory cell is in: (1) the first data state when its first transistor is in the first state and its second transistor is in the second state and (2) the second data state when its first transistor is in the second state and its second transistor is in the first state.

The semiconductor memory array may also include a comparator having a plurality of inputs to sense the states of the first and second transistors of a semiconductor dynamic random access memory cell of the plurality of semiconductor dynamic random access memory cell. A first input of the comparator is selectively coupled to a first transistor of the semiconductor dynamic random access memory cell and the second input of the comparator is selectively coupled to the second transistor of a semiconductor dynamic random access memory cell.

In one embodiment, at least one of the rows of semiconductor dynamic random access memory cells includes a source line that is connected to each of the semiconductor dynamic random access memory cells of the row. Indeed, in another embodiment, each row of semiconductor dynamic random access memory cells includes an associated source line which is connected to only the semiconductor dynamic random access memory cells of the associated row.

In another embodiment, a first input of a comparator is selectively coupled to the drain region of the first transistor of the semiconductor dynamic random access memory cell and a second input of the comparator is selectively coupled to the drain of second first transistor of a semiconductor dynamic random access memory cell. In this embodiment, each row of semiconductor dynamic random access memory cells includes an associated source line which is connected to only the semiconductor dynamic random access memory cells of the row.

The semiconductor dynamic random access memory cell may be programmed in a first data state by performing a clear operation of the first and second transistors of the semiconductor dynamic random access memory cell and then performing a write operation. In response, the first transistor of the semiconductor dynamic random access memory cell is in a first state and the second transistor of the semiconductor dynamic random access memory cell is in a second state.

Moreover, the semiconductor dynamic random access memory cell may be programmed in a first data state by first placing the first and second transistors of the semiconductor dynamic random access memory cell in a first state and thereafter placing the second transistor of the semiconductor dynamic random access memory cell is in a second state. In this embodiment, an unselected portion of the semiconductor memory array is maintained in a fixed state when programming the at least one semiconductor dynamic random access memory cell by applying a write inhibit signal to the transistors of the semiconductor dynamic random access memory cells comprising the unselected portion of the semiconductor memory array.

In one embodiment, each semiconductor dynamic random access memory cell includes two outputs including a first output connected to the drain region of the first transistor and a second output connected to the drain region of the second transistor.

In another embodiment, the gate of the first transistor and the gate of the second transistor of each semiconductor dynamic random access memory cell are each connected to an associated common gate line.

In yet another embodiment, the source region of the first transistor and the source region of the second transistor of each semiconductor dynamic random access memory cell are the same region. However, in another embodiment, the source region of the first transistor and the source region of the second transistor of each semiconductor dynamic random access memory cell are connected to different source lines.

Indeed, a first output of each semiconductor dynamic random access memory cell may be connected to the source region of the first transistor and a second output of the semiconductor dynamic random access memory cell may be connected to the source region of the second transistor. In this embodiment, the drain region of the first transistor and the drain region of the second transistor of each semiconductor dynamic random access memory cell are the same region.

Again, there are many inventions described and illustrated herein. This Summary of the Invention is not exhaustive of the scope of the present invention. Moreover, this Summary is not intended to be limiting of the invention and should not be interpreted in that manner. While certain embodiments, features, attributes and advantages of the inventions have been described in this Summary, it should be understood that many others, as well as different and/or similar embodiments, features, attributes and/or advantages of the present inventions, which are apparent from the description, illustrations and claims, which follow.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIGS. 3A and 3B illustrate a memory cell, according to certain embodiments of certain aspects of the present inventions;

FIG. 5 illustrates a memory cell including two transistors that are configured to have a common drain region, according to one embodiment of the present invention;

FIG. 6 illustrates an exemplary layout of the memory cell of FIG. 5;

FIGS. 16A–16C illustrate writing and/or programming techniques (including exemplary programming voltage values), according to another aspect of the present invention, for a memory cell of FIG. 11;

DETAILED DESCRIPTION

There are many inventions described and illustrated herein. In a first aspect, the present invention is directed to a memory cell and technique of reading data from and writing data into that memory cell. In this regard, in one embodiment of this aspect of the invention, the memory cell includes two transistors which store complementary data states. That is, the two-transistor memory cell includes a first transistor that maintains a complementary state relative to the second transistor. As such, when programmed, one of the transistors of the memory cell stores a logic low (a binary "0") and the other transistor of the memory cell stores a logic high (a binary "1").

The data state of the two-transistor complementary memory cell may be read and/or determined by sampling, sensing measuring and/or detecting the polarity of the logic states stored in each transistor of complementary memory cell. That is, the two-transistor complementary memory cell is read by sampling, sensing, measuring and/or detecting the difference in signals (current or voltage) stored in the two transistors.

With reference to FIGS. 3A and 3B, in one embodiment, memory cell 100 is a bi-stable memory cell which includes transistor 102a and transistor 102b. In a first logic state of memory cell 100, transistor 102a stores a logic low and transistor 102b stores a logic high. (See, for example, FIG. 3A). In contrast, in a second logic state of memory cell 100, transistor 102a stores a logic high and transistor 102b stores a logic low. (See, for example, FIG. 3B).

Figure 1A:
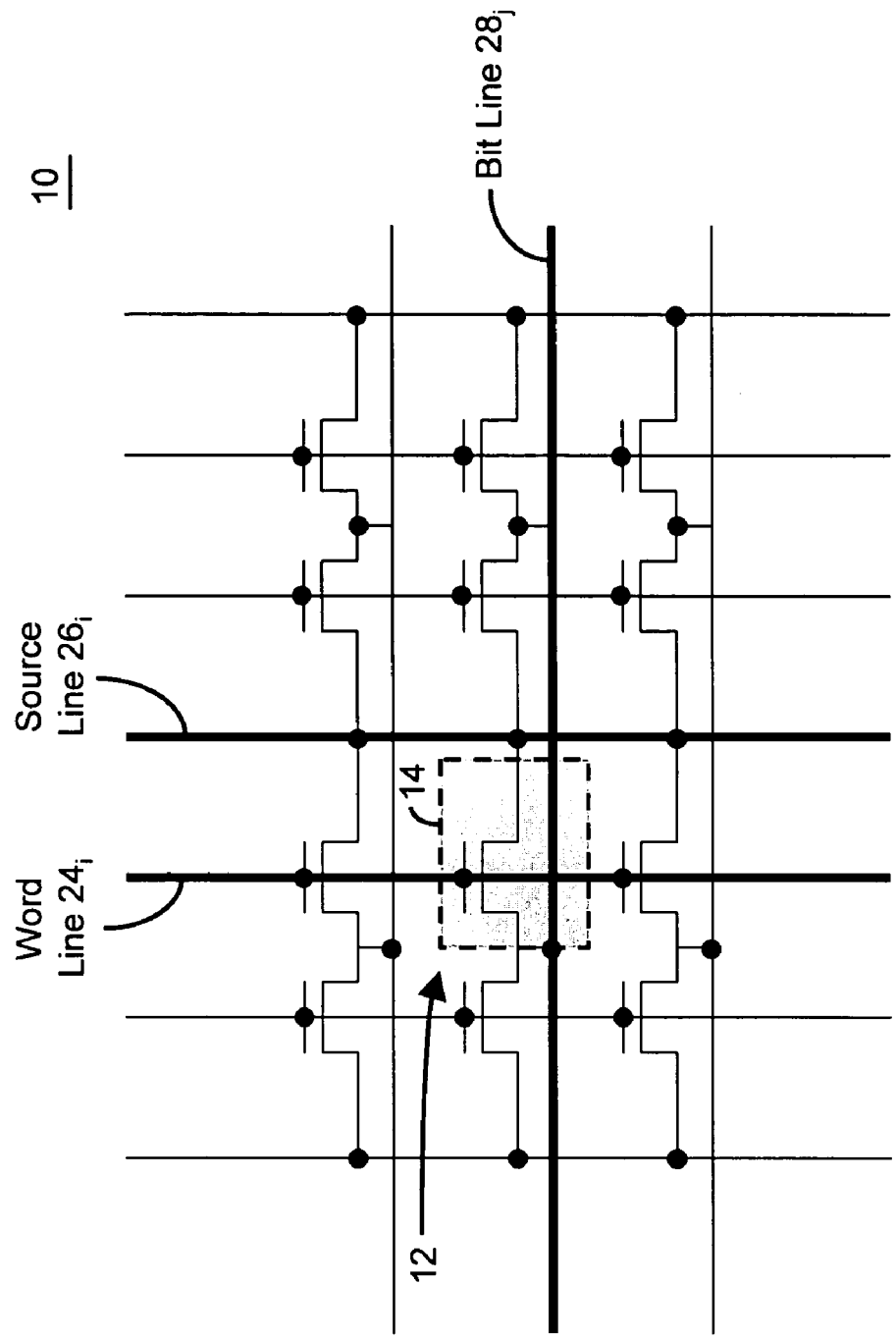
FIG. 1A is a schematic representation of a semiconductor DRAM array as illustrated (and described) in the Semiconductor Memory Device Patent Application.
Figure 1B:
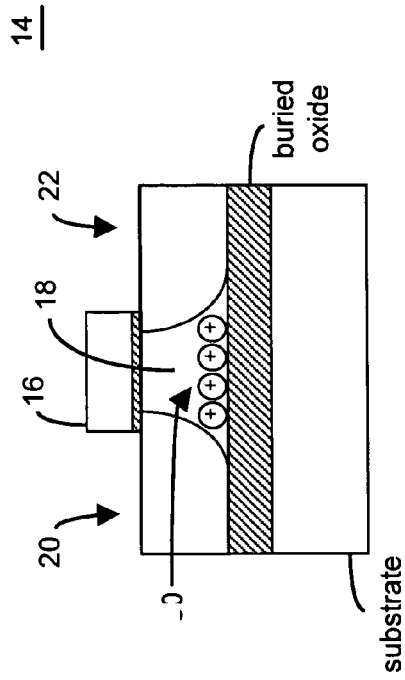
FIG. 1B illustrates a memory cell according to the Semiconductor Memory Device Patent Application.
Figure 2B:
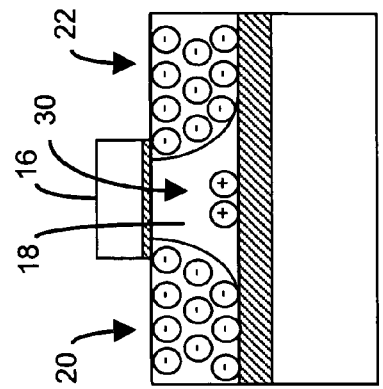
FIGS. 2A and 2B are exemplary schematic illustrations of the charge relationship, for a particular memory state, of the floating body, source and drain regions of a memory cell according to the Semiconductor Memory Device Patent Application.
Figure 2A:
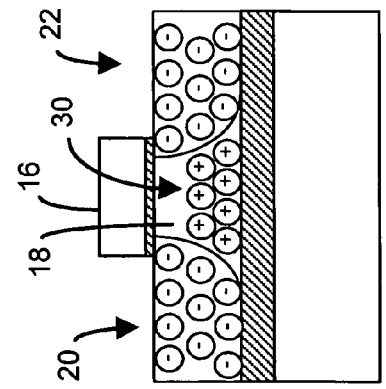
Figure 4:
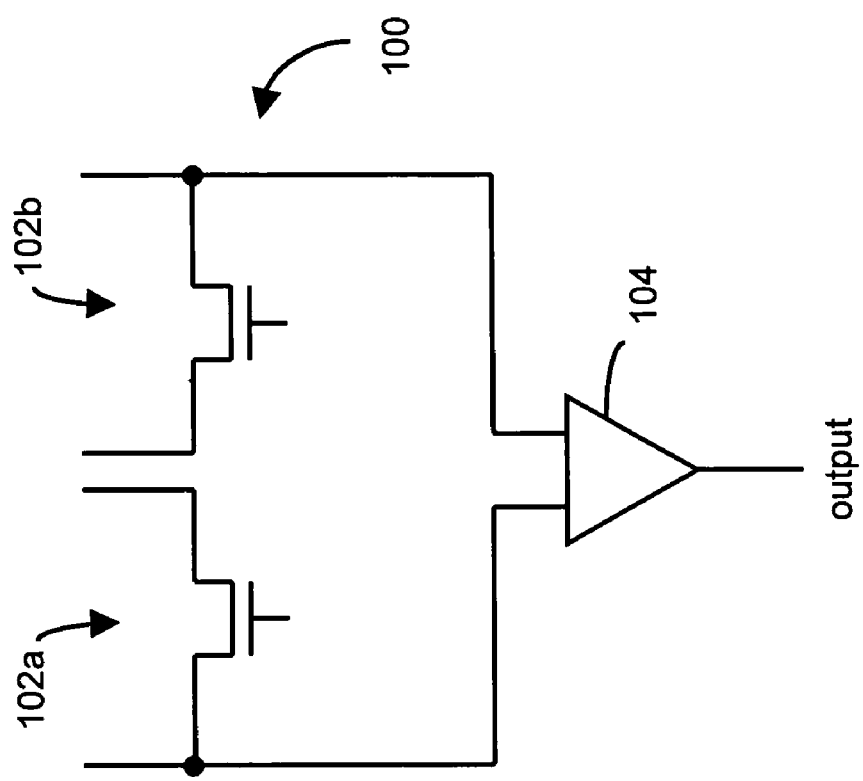
FIG. 4 illustrates a memory cell, in conjunction with a read amplifier, according to one embodiment of the present invention.

With reference to FIG. 4, the state of memory cell 100 may be read and/or determined by comparator 104, which may be a voltage or current type comparator (for example, a cross-coupled sense amplifier). In this regard, comparator 104 may compare the different logic states stored in transistor 102a and transistor 102b. Thus, where transistor 102a and transistor 102b store either logic "1" or logic "0", the difference is either 1−0=1 or 0−1=−1. As such, the read window may be described as the absolute difference between the logic high state and logic low state (i.e., 1−(−1)=2), which may be 2× the read window of the conventional memory cell. Notably, pass gates and/or column switch circuitry (not illustrated) may be employed to selectively connect transistors 102a and 102b to comparator 104 to facilitate the read operation of the data state of memory cell 100.

Thus, memory cell 100 of the present invention may include several advantages relative to conventional dynamic random access memory cells, including, for example: (i) the read operation is less sensitive to variation in the values of the binary states because a logic state is determined by the difference in states of the individual transistors, (ii) no reference circuit is necessary, (iii) the memory cell 100 includes a larger read window (as compared to conventional dynamic random access memory cells), which results in faster access time, and (iv) a less complicated and/or complex sense amplifier may be employed.

The transistor 102a and/or transistor 102b may be symmetrical or non-symmetrical devices. Where transistors 102a and/or transistor 102b are symmetrical, the source and drain regions are essentially interchangeable. However, where transistors 102a and/or transistor 102b are non-symmetrical devices, the source or drain regions of transistor 102a and/or transistor 102b may have different electrical, physical, doping concentration and/or doping profile characteristics. As such, the source or drain regions of the non-symmetrical device are typically not interchangeable.

In one embodiment, memory cell 100 includes transistors 102a and 102b that have the same or similar characteristics. Indeed, transistors 102a and/or 102b may have the same or similar characteristics as the transistors described and illustrated in the Semiconductor Memory Device Patent Application. Notably, transistors 102a and 102b may employ any type of design and/or control technique, whether now known or later developed, including, for example, those discussed above in the Semiconductor Memory Device Patent Application. All such designs of and/or control techniques for transistors 102a and 102b, whether now known or later developed, are intended to be within the present invention.

In those instances where transistors 102a and 102b are designed to have the same or similar characteristics, it may be advantageous to physically locate transistors 102a and 102b nearby each other. In this way, during manufacturing, transistors 102a and 102b are likely to be fabricated with little to no process variations or differences and, as such, transistors 102a and 102b are likely to have the same or similar electrical, physical, doping concentration and/or profile characteristics.

A memory device may include a plurality of memory cells 100 arranged in repeating patterns. The memory cell 100 may be arranged in an array in many different ways. All layout configurations for transistors 102a and 102b, whether now known or later developed, are intended to be within the present invention. For example, in one layout, transistors 102a and 102b are configured to have a common drain region. With reference to FIGS. 5 and 6, in one embodiment, transistors 102a and 102b include a common drain regions 110a and 110b. Data is written into or read from transistors 102a and 102b by applying suitable control signals to source regions 108a and 108b, drain regions 110a and 110b and/or gates 112a and 112b, respectively. In response, charge carriers are accumulated in or emitted from electrically floating body regions 106a and 106b wherein the data state of each transistors 102a and 102b is defined by the amount of carriers within electrically floating body regions 106a and 106b, respectively.

Figure 7A:
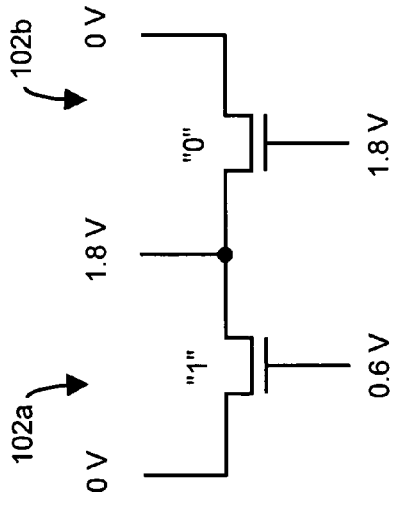
FIGS. 7A, 7B, 8A and 8B illustrate writing and/or programming techniques including exemplary programming voltage values, according to two embodiments of the present invention, for the memory cell including two transistors that are configured to have a common drain region.
Figure 7B:
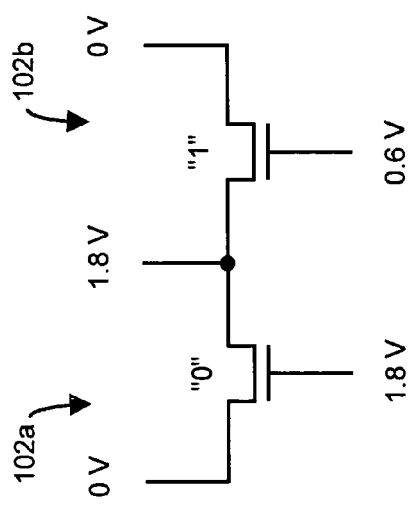

In particular, with reference to FIGS. 7A and 7B, in one embodiment, a logic low (binary "0" state) is written into transistor 102a and a logic high (binary "1" state) is written into transistor 102b using the indicated (exemplary) voltage levels. Notably, the voltage levels indicated in FIGS. 7A and 7B may be relative or absolute. In this regard, a logic low may be written into transistor 102a (FIG. 7A) or transistor 102b (FIG. 7B) using the voltages indicated. Alternatively, the voltages indicated may be relative in that each voltage level, for example, may be increased or decreased by a given voltage (for example, 0.5 volts).

Figure 8A:
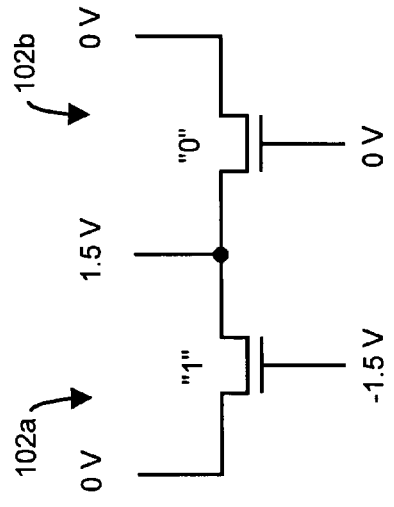
Figure 8B:
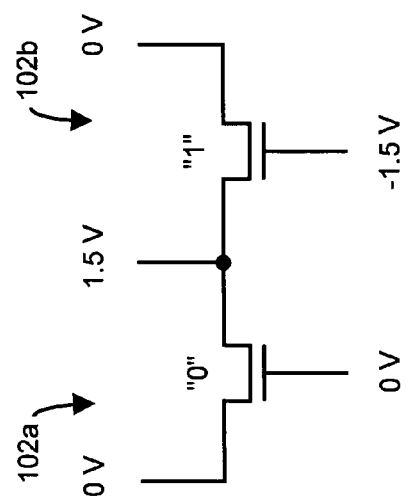

With reference to FIGS. 8A and 8B, the logic levels may be programmed into transistors 102a and 102b using a low power consumption technique. The low power consumption technique employs positive and negative control signals/voltages in order to program the complementary states. For example, a logic high is written into transistor 102a (FIG. 8B) and a logic high is written into transistor 102b (FIG. 8A) using a negative gate voltage.

Figure 9:
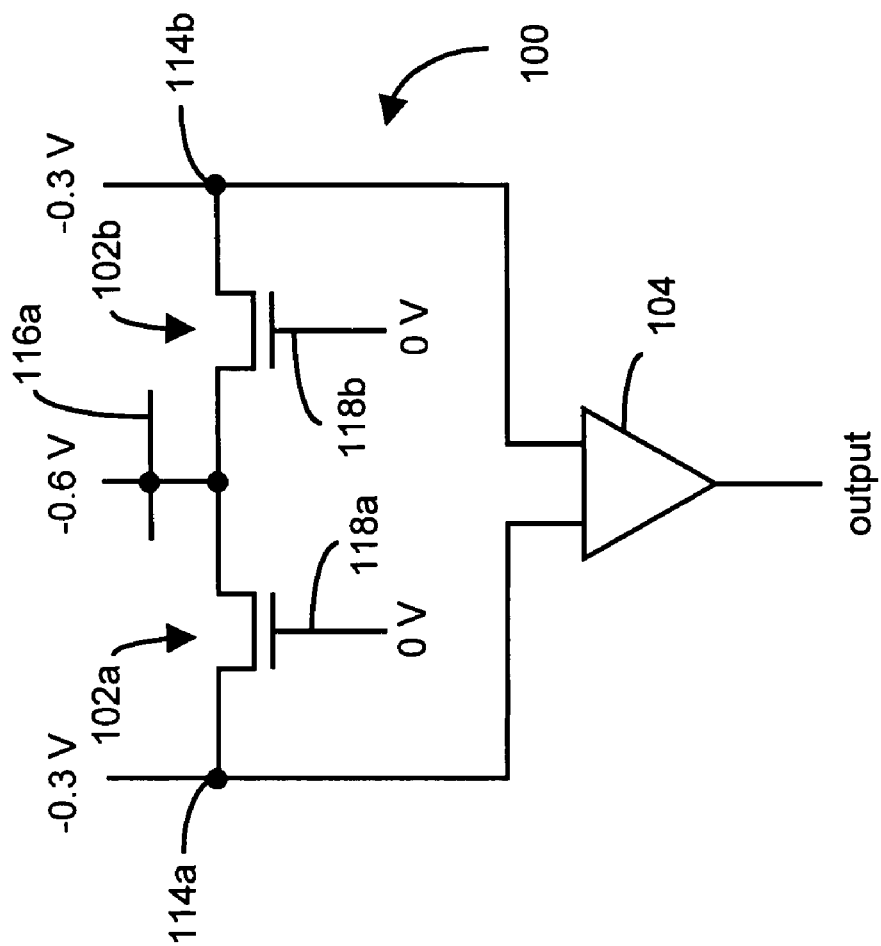
FIG. 9 illustrates a memory cell of this embodiment, in conjunction with a read amplifier and read operation including exemplary voltage values, according to an embodiment of the present invention, for the memory cell including two transistors that are configured to have a common drain region.

The source regions 108a and 108b of transistors 102a and 102b, respectively, are employed to read, sense and/or determine the data state of cell 100. In this regard, source regions 108a and 108b are selectively connected to comparator 104 (for example, a voltage or current sense amplifier) to permit the logic value of memory cell 110 to be read, sensed and/or determined. As indicated above, transistors 102a and 102b may store the respective data state via majority carriers within the electrically floating body regions 106a and 106b, respectively. In response to read control signals, the logic state of each transistor 102a and 102b is read by comparator 104 in a differential manner. Exemplary read voltage signals are indicated in FIG. 9.

Figure 10A:
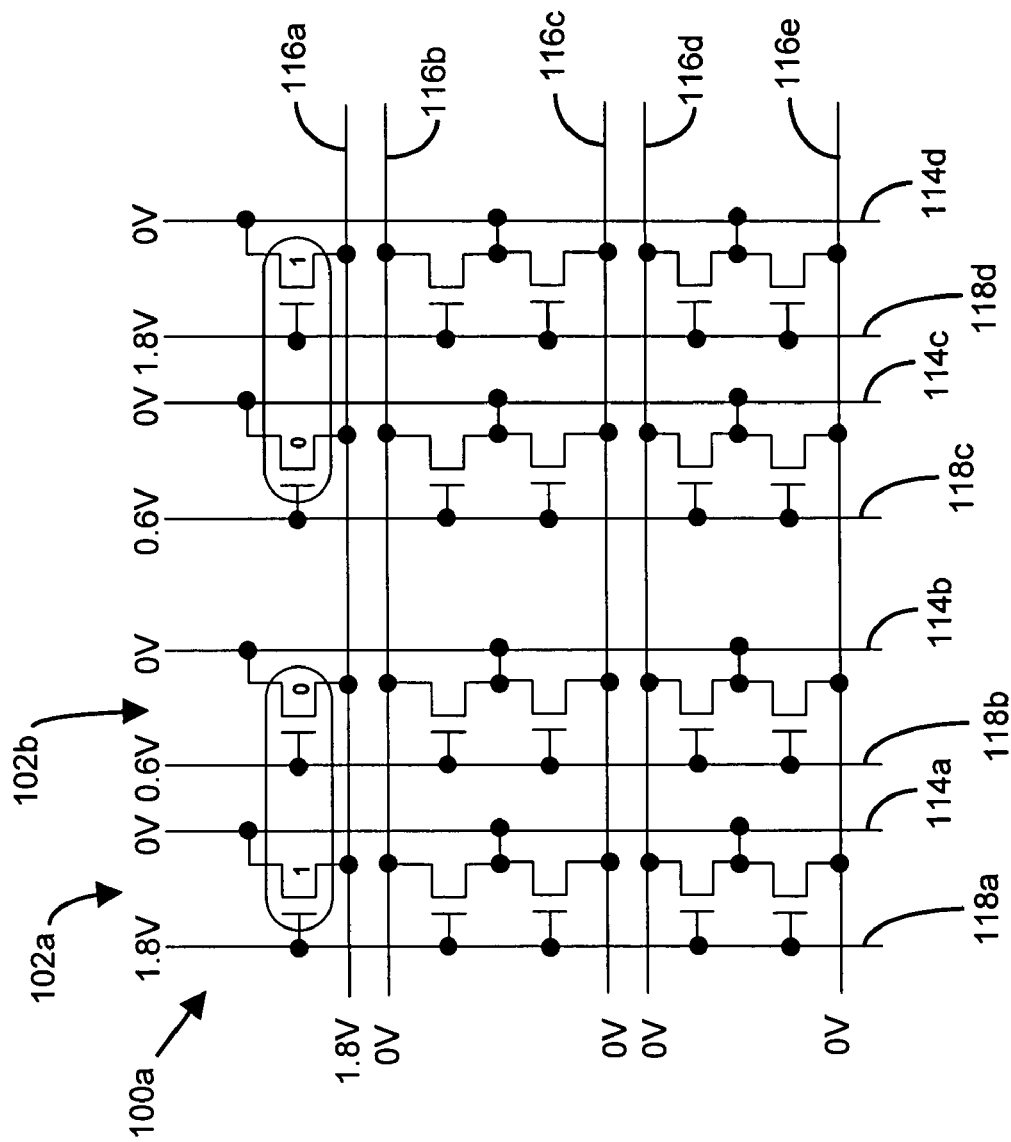
FIGS. 10A and 10B illustrate writing and/or programming techniques including exemplary programming voltage values, according to two embodiments of the present invention, for a memory array including a plurality of memory cells each having two transistors that are configured to have a common drain region.
Figure 10B:
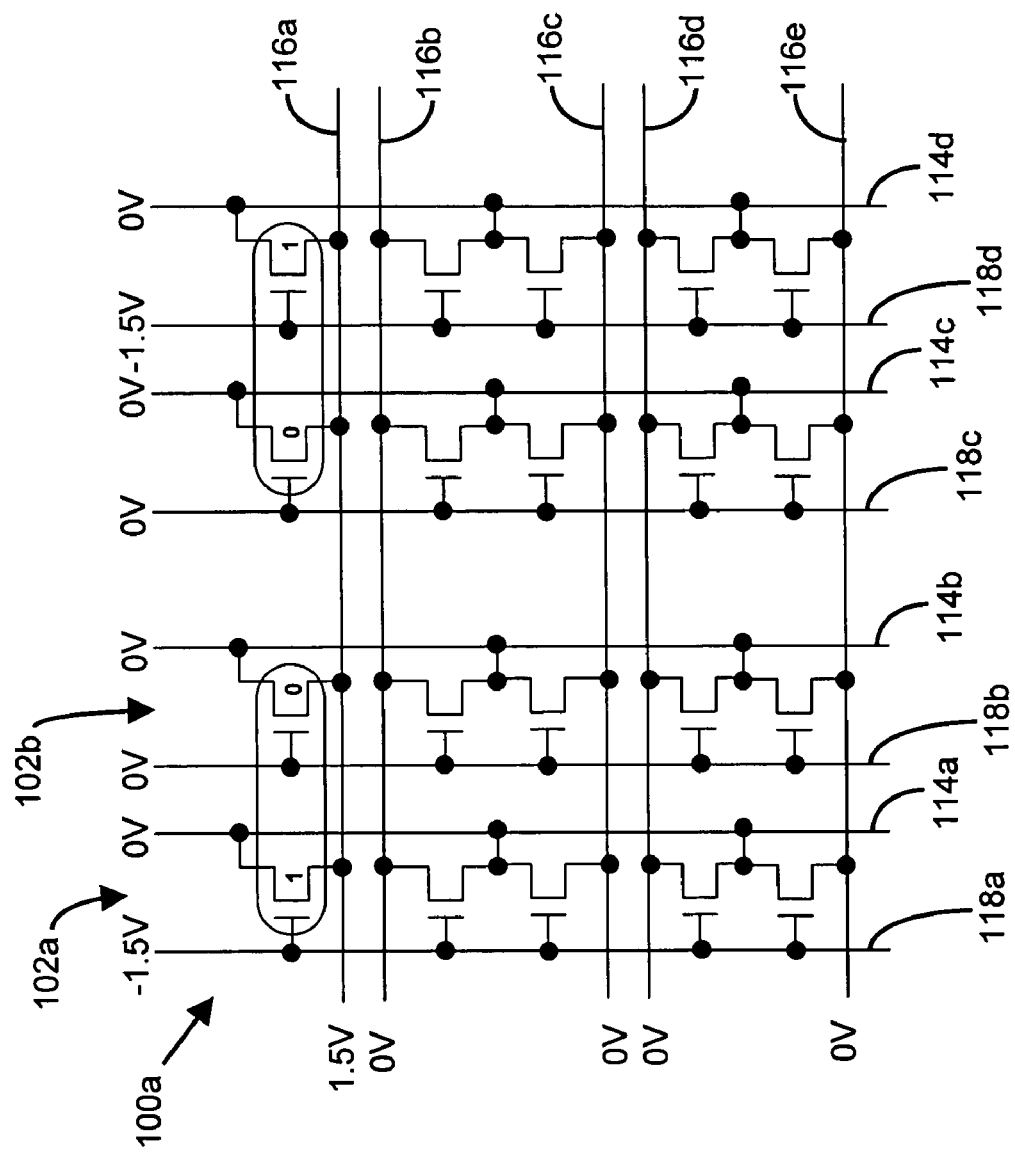
Figure 10C:
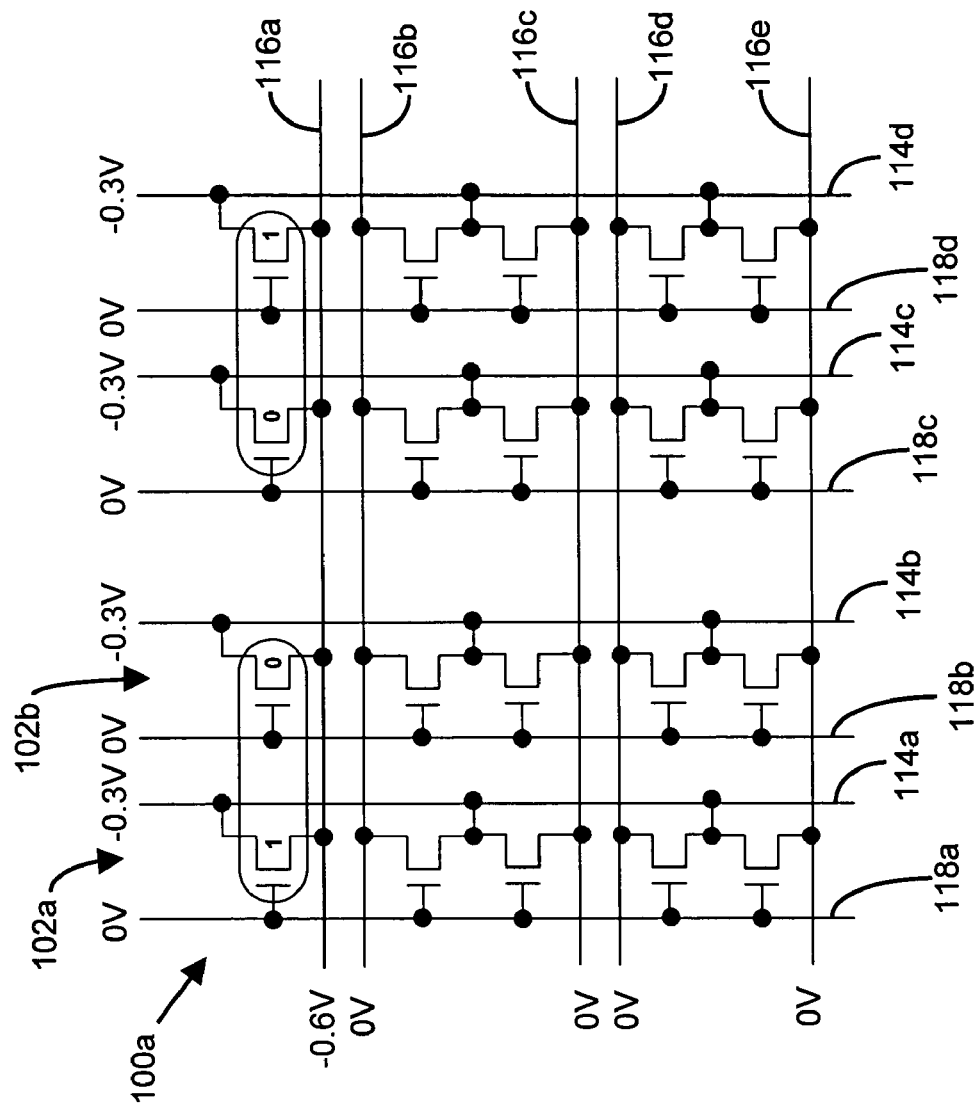
FIG. 10C illustrates exemplary read operation voltage values, according to an embodiment of the present invention, for a memory array including a plurality of memory cells each having two transistors that are configured to have a common drain region.

Notably, pass gates and/or column switch circuitry (not illustrated) may be employed to selectively connect source regions 108a and 108b of transistors 102a and 102b, respectively, to comparator 104 to facilitate the read operation of the data state of cell 100. Moreover, as is apparent from FIG. 6, a memory device may include a plurality of memory cells 100, arranged in repeating patterns. In this regard, with reference to FIGS. 10A and 10B, the exemplary write techniques, described above, are illustrated in a schematic representation of a memory matrix. Further, with reference to FIG. 10C, the exemplary read technique, described above, is illustrated in a schematic representation of a memory matrix. Notably, the exemplary read and write techniques of FIGS. 10A–10C, including the exemplary levels of the read and write voltages, may reduce, minimize and/or eliminate any disturbance issues (for example, issues of stored charge loss or gain within memory cells) caused to memory cells having common gate lines, drain lines and/or source lines with memory cells that are accessed via read and write operations.

Figure 11:
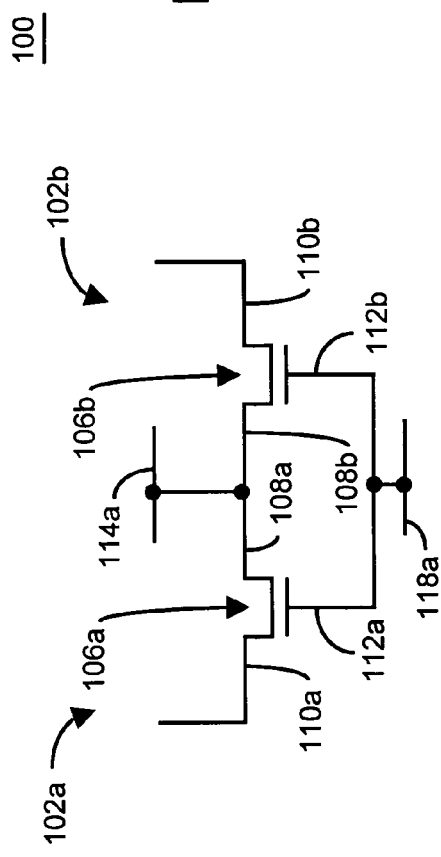
FIG. 11 illustrates a memory cell including two transistors that are configured to have a common source region and connected gates, according to one embodiment of the present invention.
Figure 12:
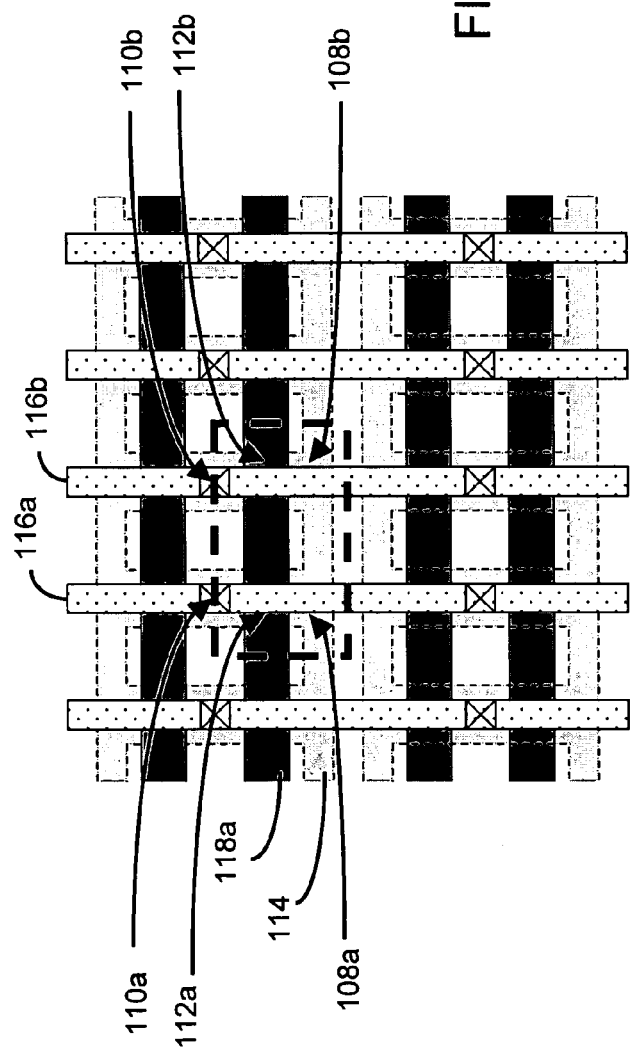
FIG. 12 illustrates an exemplary layout of the memory cell of FIG. 11.
Figure 13B:
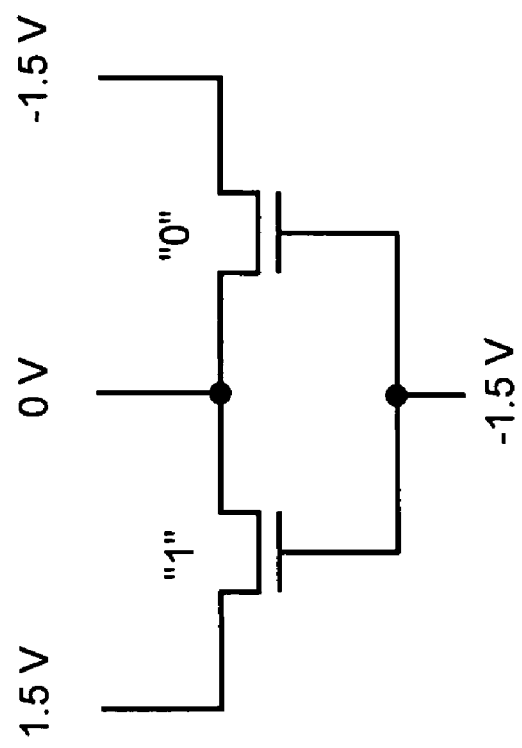
FIGS. 13A and 13B illustrate writing and/or programming techniques including exemplary programming voltage values, for the memory cell of FIG. 11.
Figure 13A:
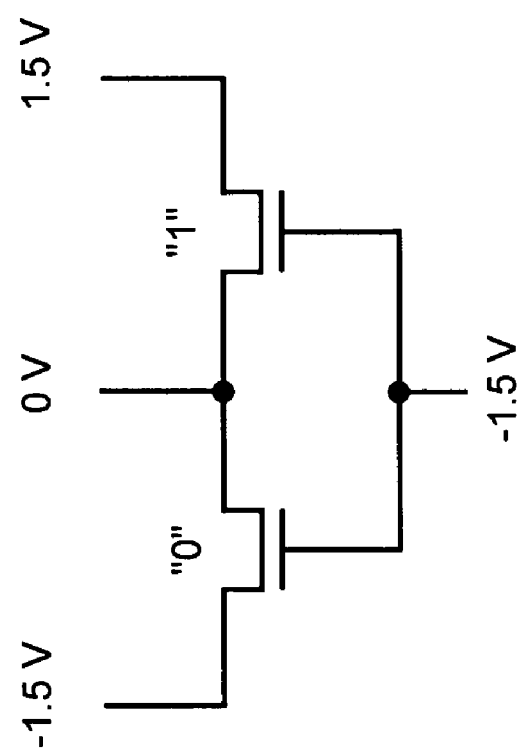
Figure 14:
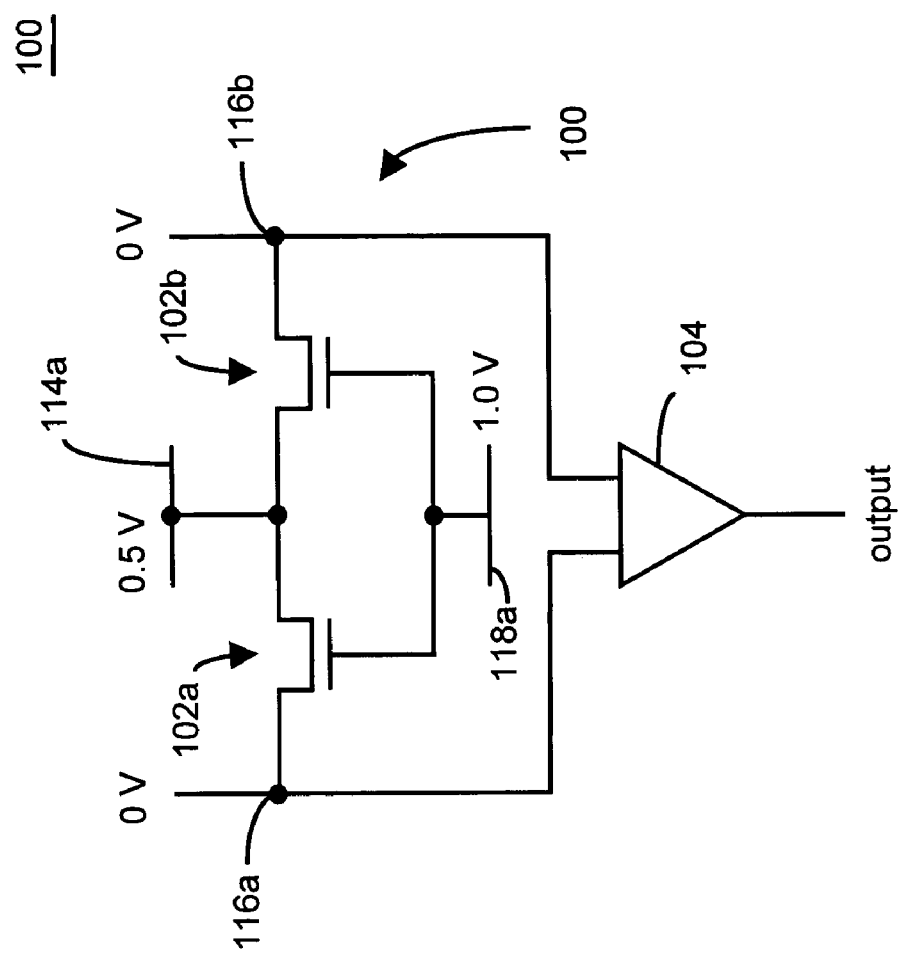
FIG. 14 illustrates a memory cell of FIG. 11, in conjunction with a read amplifier and read operation including exemplary voltage values, according to an embodiment of the present invention.

In another embodiment, with reference to FIGS. 11 and 12, memory cell 100 may include a layout whereby transistors 102a and 102b include (1) common source regions 108a and 108b, respectively, and (2) gates 112a and 112b, respectively, that are connected to the same gate line 118. Exemplary write techniques are indicated in FIG. 13A (write logic low) and FIG. 13B (write logic high). An exemplary read technique is illustrated in FIG. 14. Notably, the voltage levels indicated in FIGS. 13A, 13B and 14 may be relative or absolute. In this regard, a logic low may be written into transistor 102a (FIG. 13A) or transistor 102b (FIG. 13B)

using the voltages indicated. Alternatively, the voltages indicated may be relative in that each voltage level, for example, may be increased or decreased by a given voltage (for example, 0.25 volts).

Figure 15A:
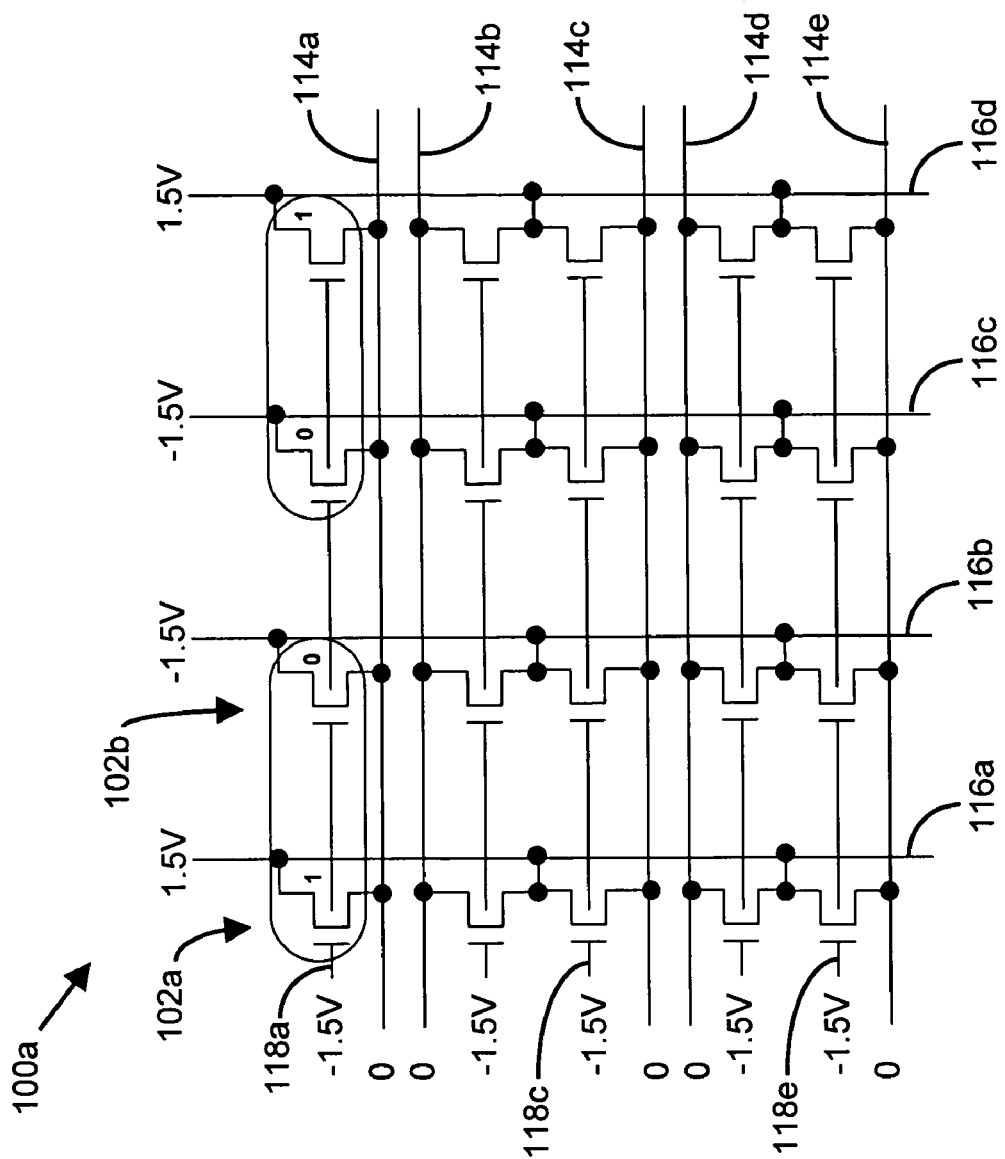
FIGS. 15A and 15B illustrate writing and/or programming techniques including exemplary programming voltage values, for a memory array including a plurality of memory cells of FIG. 11.
Figure 15B:
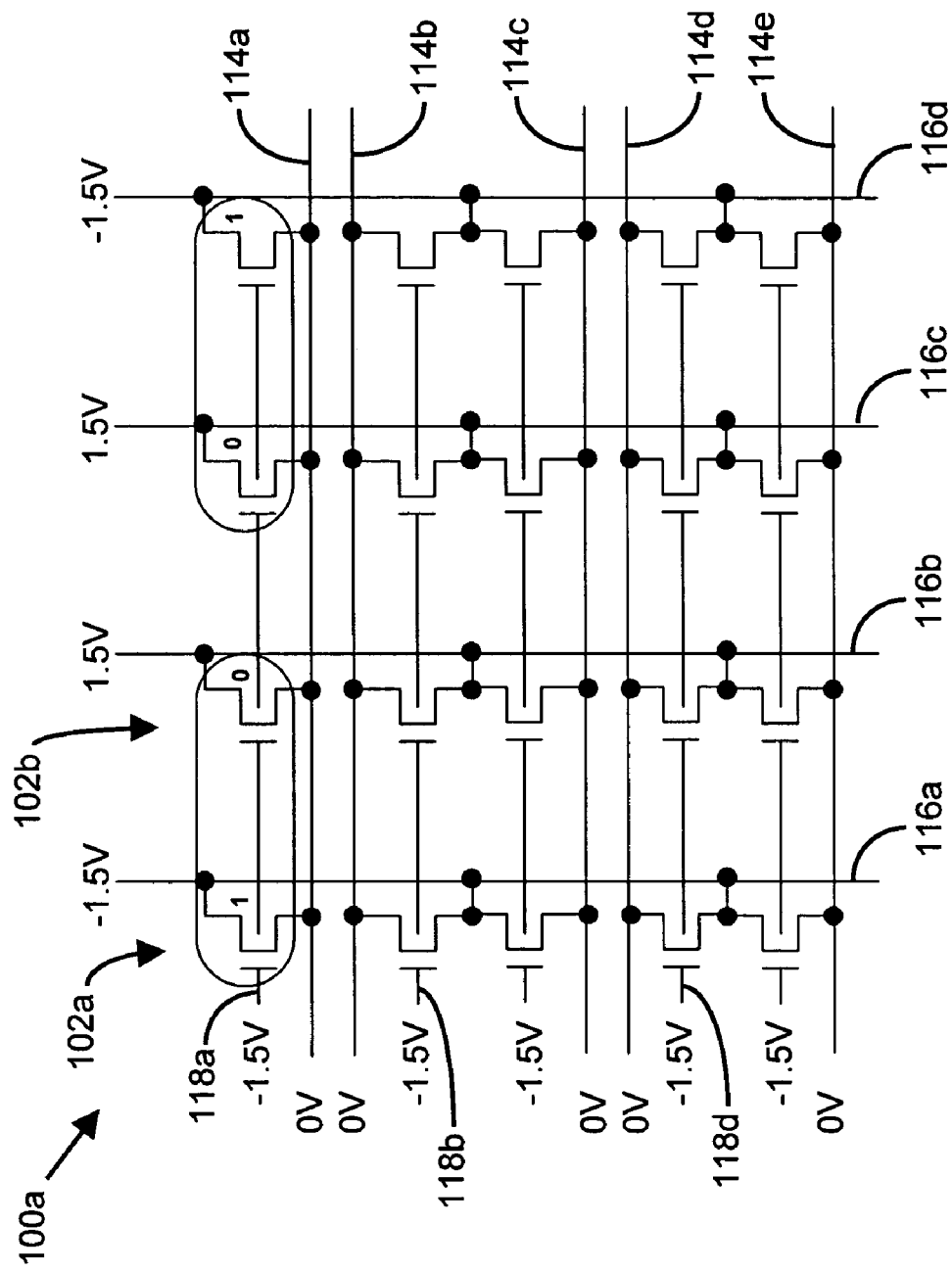
Figure 15C:
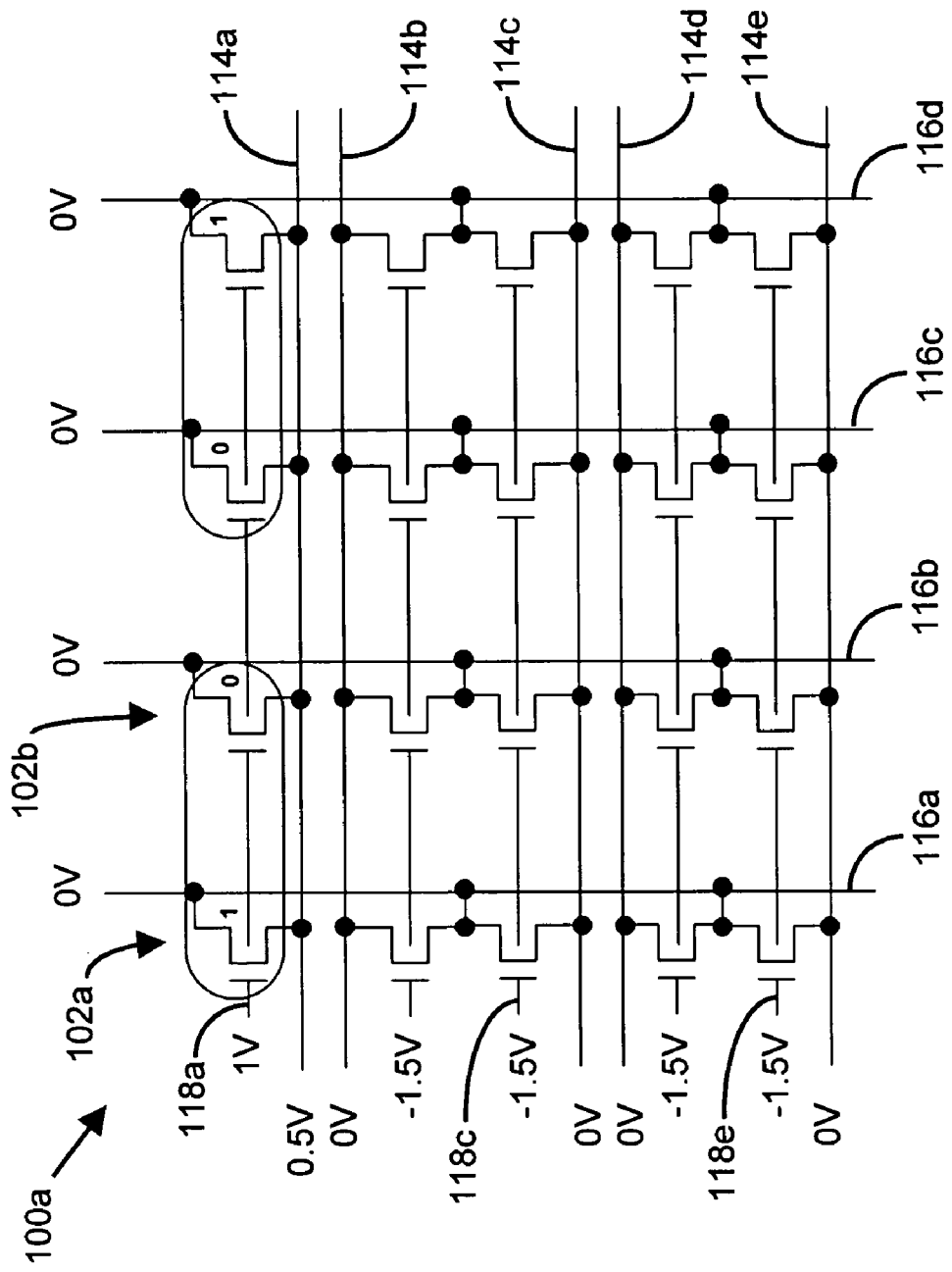
FIG. 15C illustrates exemplary read operation voltage values, according to an embodiment of the present invention, for a memory array including a plurality of memory cells of FIG. 11.

A memory array having a plurality of memory cells 100 wherein the source regions and gates (gate lines) of transistors 102a and 102b are in common may include a layout as illustrated in FIGS. 15A–15C. In this regard, with reference to FIGS. 15A and 15B, exemplary write techniques of the memory array of this embodiment are illustrated in a schematic representation of a memory matrix. With reference to FIG. 15C, an exemplary read technique is illustrated in a schematic representation of a memory matrix including a plurality of memory cells 100 configured with common source regions and gates (gate line). Notably, the exemplary read and write techniques of FIGS. 15A–15C, including the exemplary levels of the read and write voltages, may reduce, minimize and/or eliminate any disturbance issues (to neighboring cells) that may result using other read and write voltage levels.

In certain embodiments, it may be advantageous to further reduce, minimize and/or eliminate any issues of disturbance (for example, issues of stored charge loss or gain within memory cells) of the data states of memory cells having common gate lines, drain lines and/or source lines with those memory cells that are being accessed (i.e., being read from or written to). In one embodiment, a two-step write operation may be employed to program memory cell 100a with little to no disturbance to adjacent and/or neighboring cells (i.e., cells that share source lines, drain lines and/or gate lines). In this regard, an entire row of memory cells may first be written to the same logic state and thereafter, individual bits are written to the opposite state in accordance with a desired data state (i.e., the individual bits are written to another state to reflect a desired data state).

In particular, with reference to FIG. 16A, in one embodiment, the memory cells having a common source line are first written to the same logic state (for example, logic high or binary "1"). In this way, the state of memory cell 100 is "cleared". Thereafter, individual transistors 102 of memory cells 100 are written to a particular, desired and/or predetermined logic state (see, for example, FIG. 16B (write "0") and FIG. 16C (write "1")) according to the particular, desired and/or predetermined logic state of memory cell 100. That is, one of the transistors of memory cell 100 is written to logic low (binary "0") to write either a logic high or logic low into memory cell 100 (i.e., transistor 102a of FIG. 16B to store logic low in memory cell 100; and transistor 102b of FIG. 16C to store logic high in memory cell 100). Notably, writing logic low to the other transistor of memory cell 100 is inhibited by applying a suitable bitline voltage.

Thus, in this embodiment, the first step of the write operation clears the memory cells having a common source line and the second step writes or stores new data or the previous data (in the event that the data did not change). Array architectures employing this write operation technique may have an advantage that the memory cells of the array are not "disturbed" (or experience little and/or negligible disturbance) because "high" voltages are applied in the row direction (i.e., on source lines 114) but not in the column direction (i.e., on the drain lines 116). Notably, this write technique may be performed as a page mode write where the page is first "cleared" and then individual bytes (or bits) in a page are written to a new state.

Figure 17:
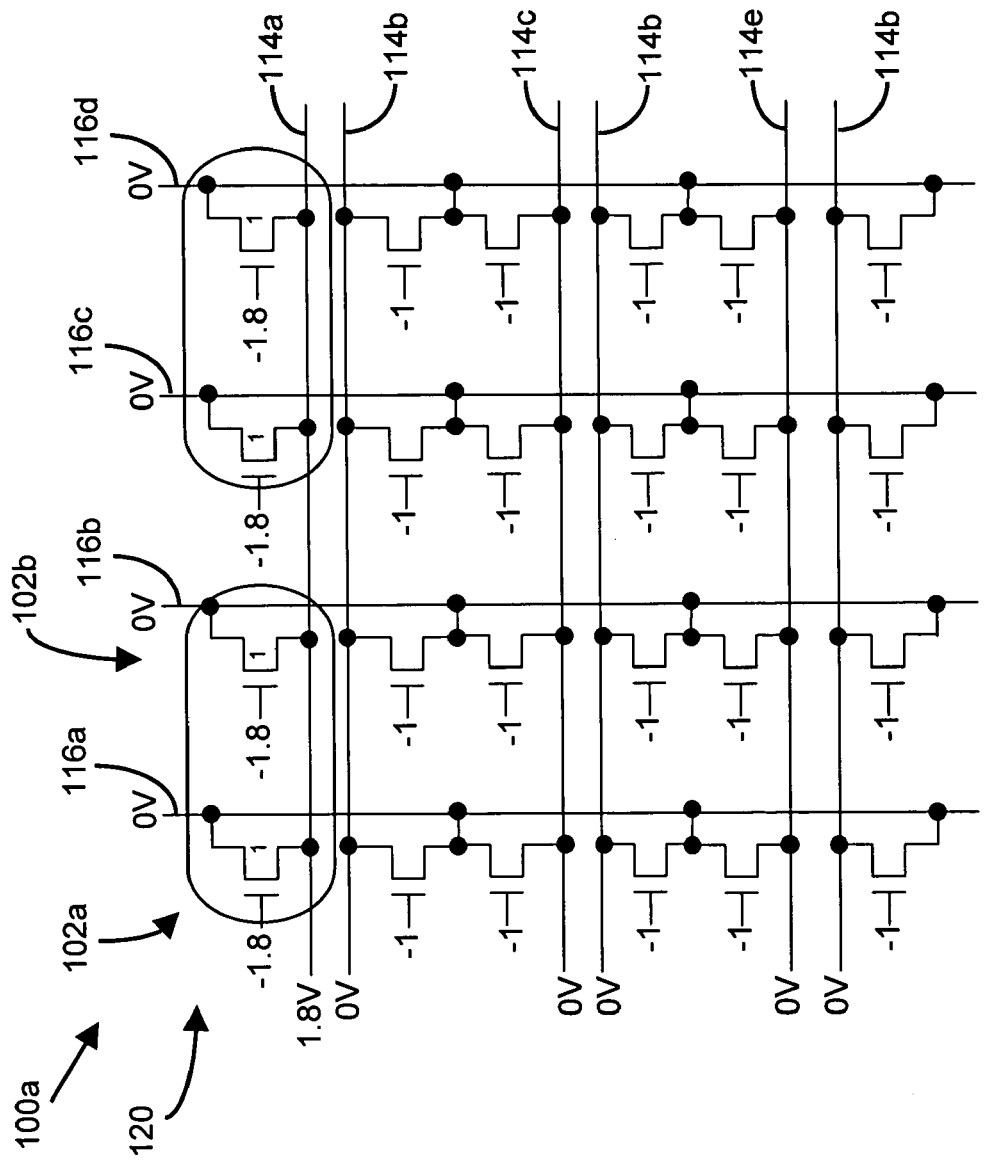
FIGS. 17 and 18 illustrate a memory array including a plurality of memory cells having a separate source line array that define a particular row of memory cells, and exemplary writing and/or programming techniques (including exemplary programming voltage values), according to another aspect of the present invention.

Such a write technique may also be suitable for other memory array architectures or configurations. For example, the write technique may be implemented where memory cells 100 of each row of transistors 102 has a dedicated source line to minimize, reduce and/or eliminate disturbance on adjacent rows. With reference to FIGS. 17, 18, 19A and 19B, and 20, in one embodiment, a given row may be written to by applying a clear operation followed by a selective write operation. In this regard, a plurality of memory cells 100, having gates that are connected to a common gate line, are arranged to form row 120. Exemplary voltages that implement a clear operation for row 120 and maintain the remaining portion of the array in a fixed state (i.e., unchanged in response to the clear operation) are indicated in FIG. 17. In response, the same logic state (for example, logic high or binary "1") is stored in both transistors 102a and 102b of memory cells 100 of row 120. In this way, the state of memory cell 100 is "cleared".

Figure 18:
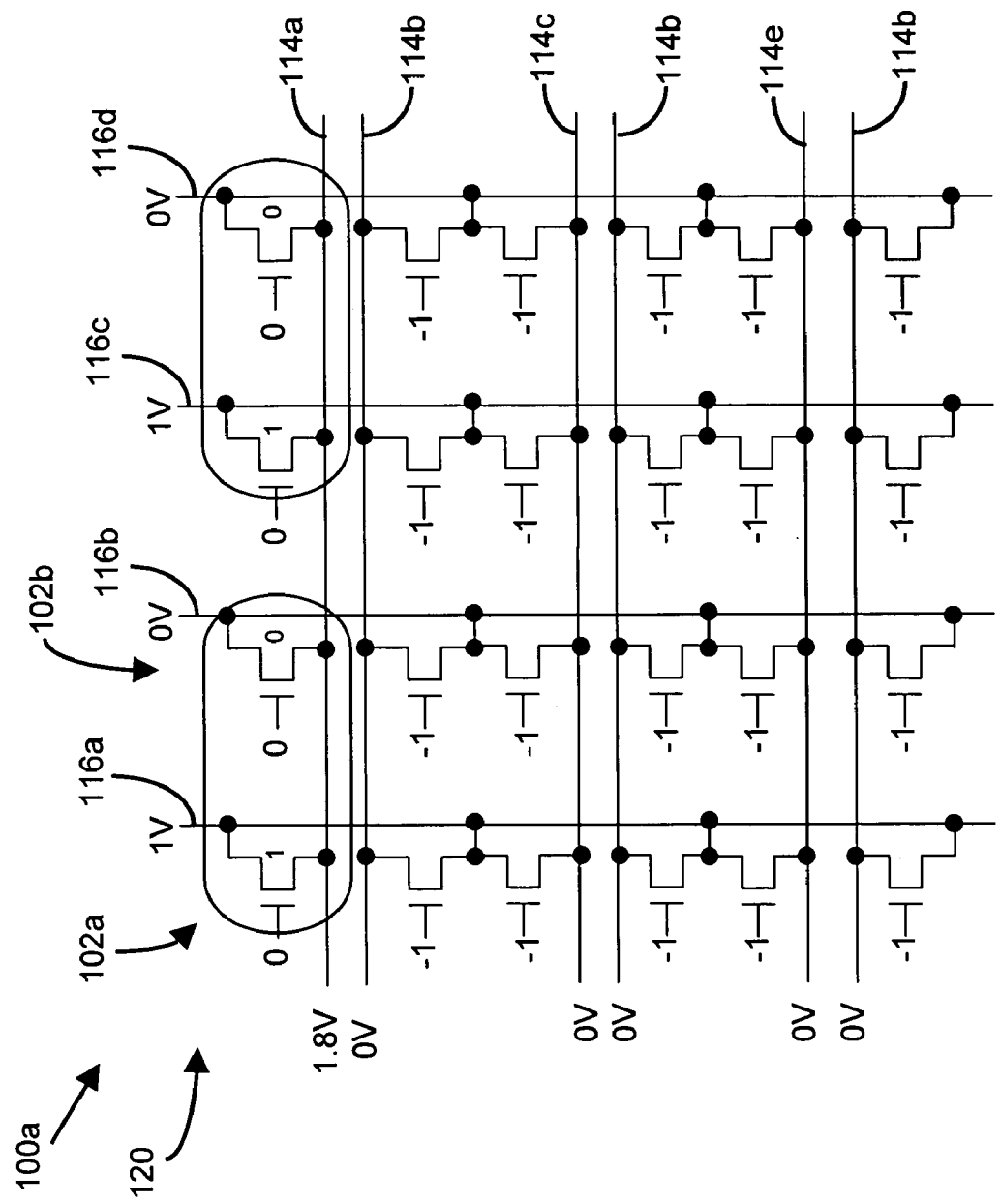

Thereafter, individual transistors 102a and 102b of the memory cells 100 of row 120 are written to a particular, desired and/or predetermined logic state (see, for example, FIG. 18 (write "1") in memory cell 100a) in order to store a particular, desired and/or predetermined logic state in memory cell 100. That is, as described above, one of the transistors of memory cell 100 is written to logic low (binary "0") to write either a logic high or logic low into memory cell 100. Notably, writing logic low to the other transistor of the memory cell 100 is inhibited by applying a suitable bitline voltage.

Figure 19A:
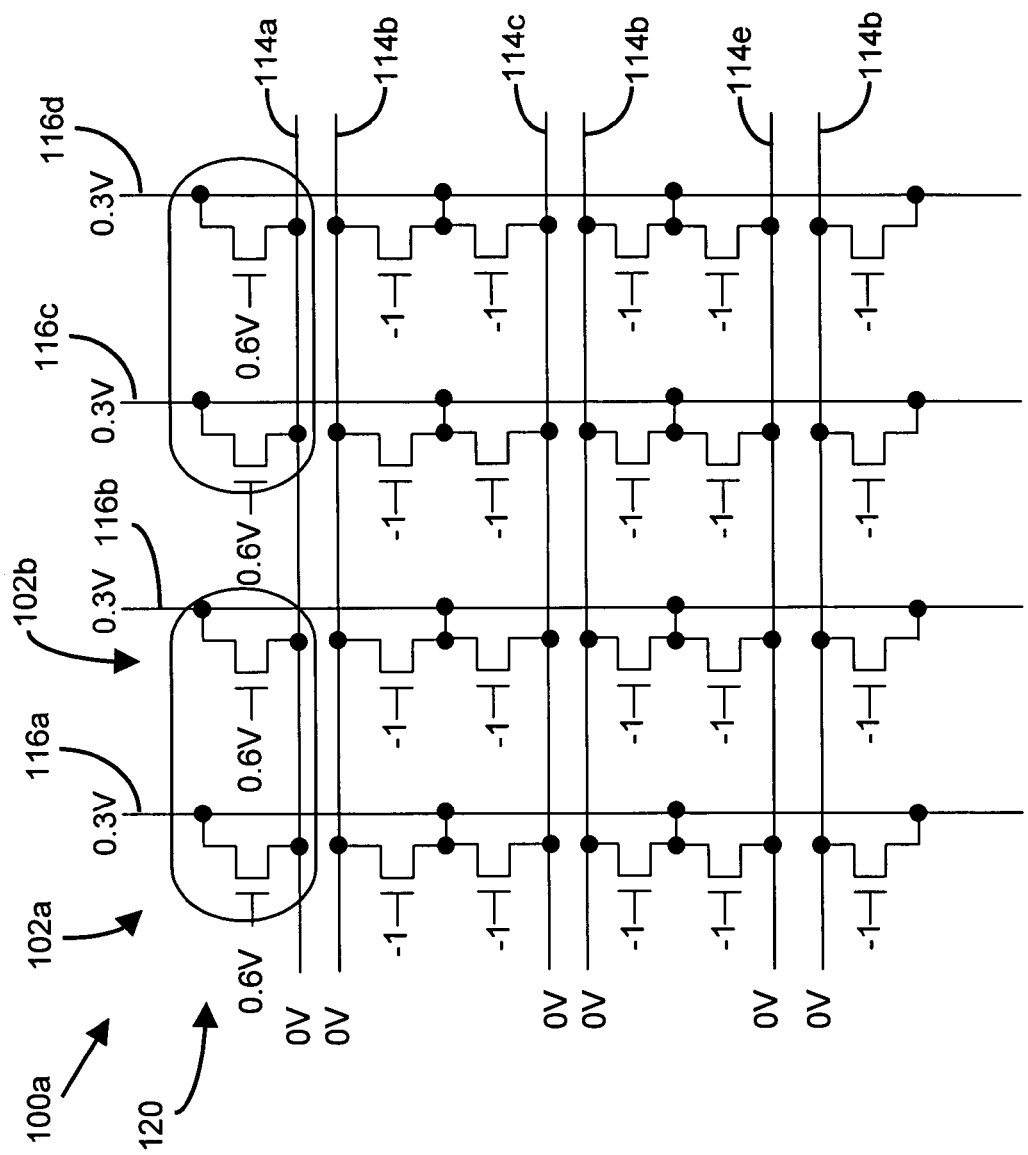
FIGS. 19A and 19B illustrate exemplary and alternative read operation voltage values, according to an embodiment of the present invention, for a memory array of FIGS. 17 and 18.
Figure 19B:
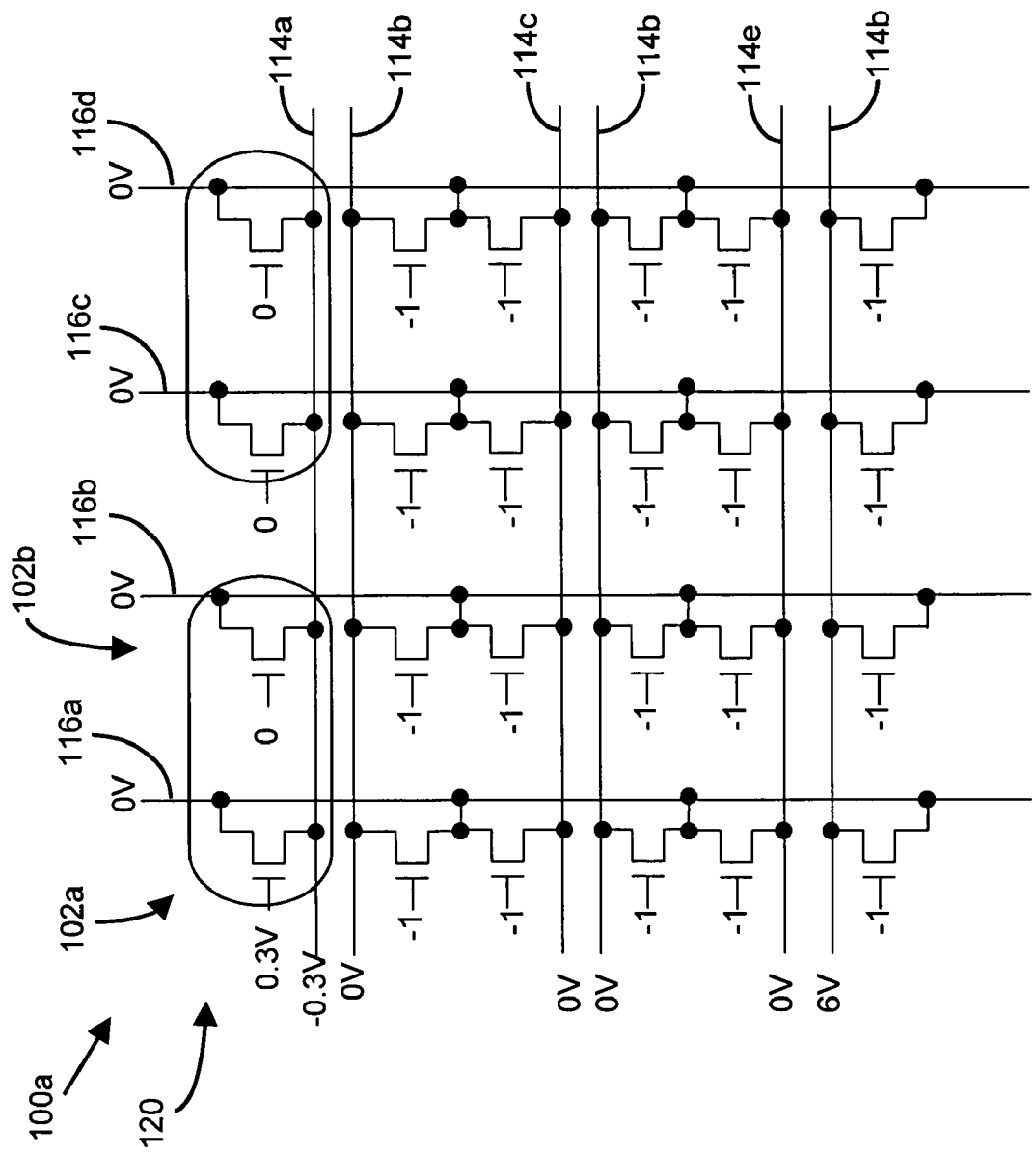
Figure 20:
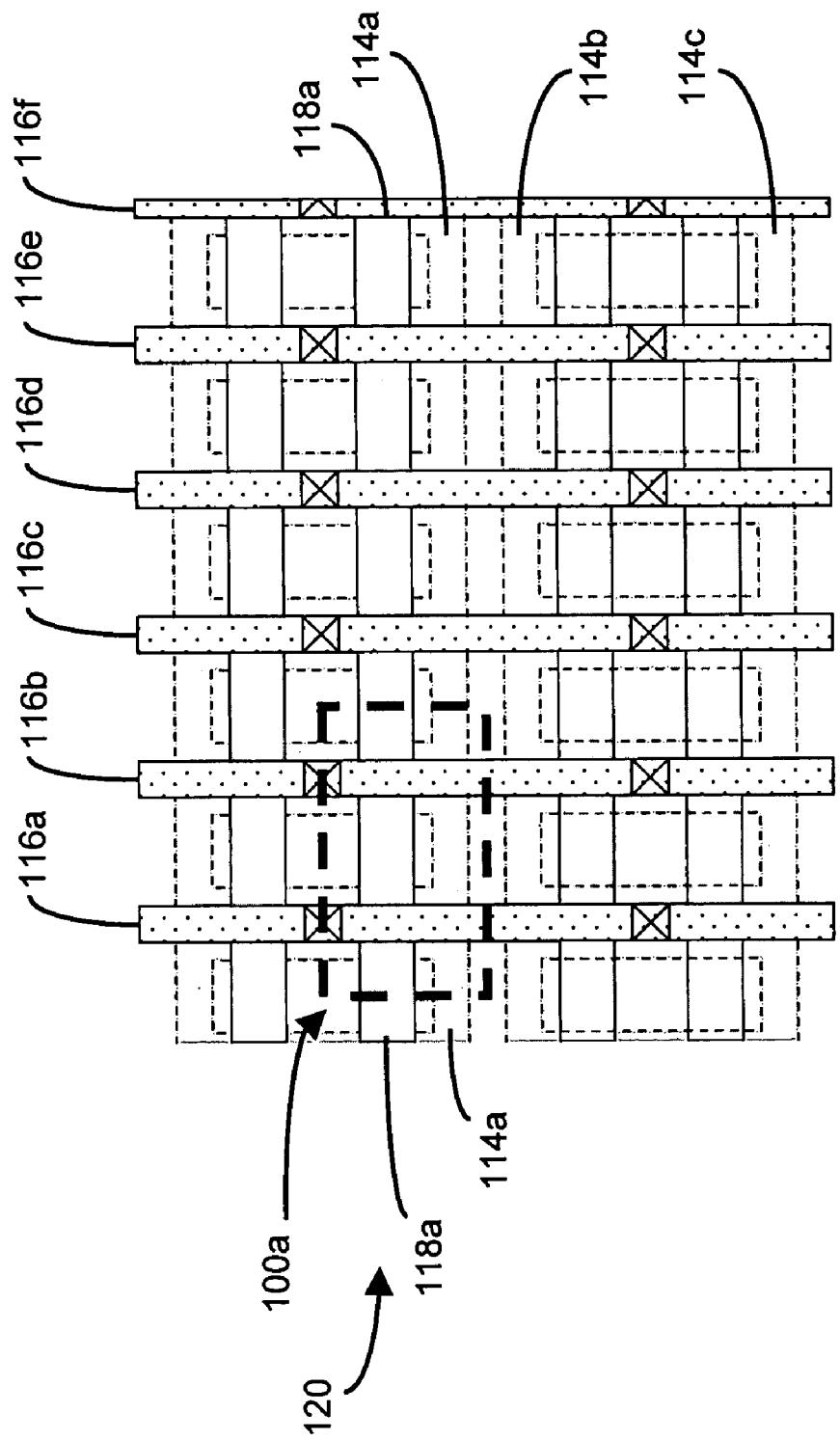
FIG. 20 illustrates an exemplary layout of the memory array of FIGS. 17 and 18.
Figure 21:
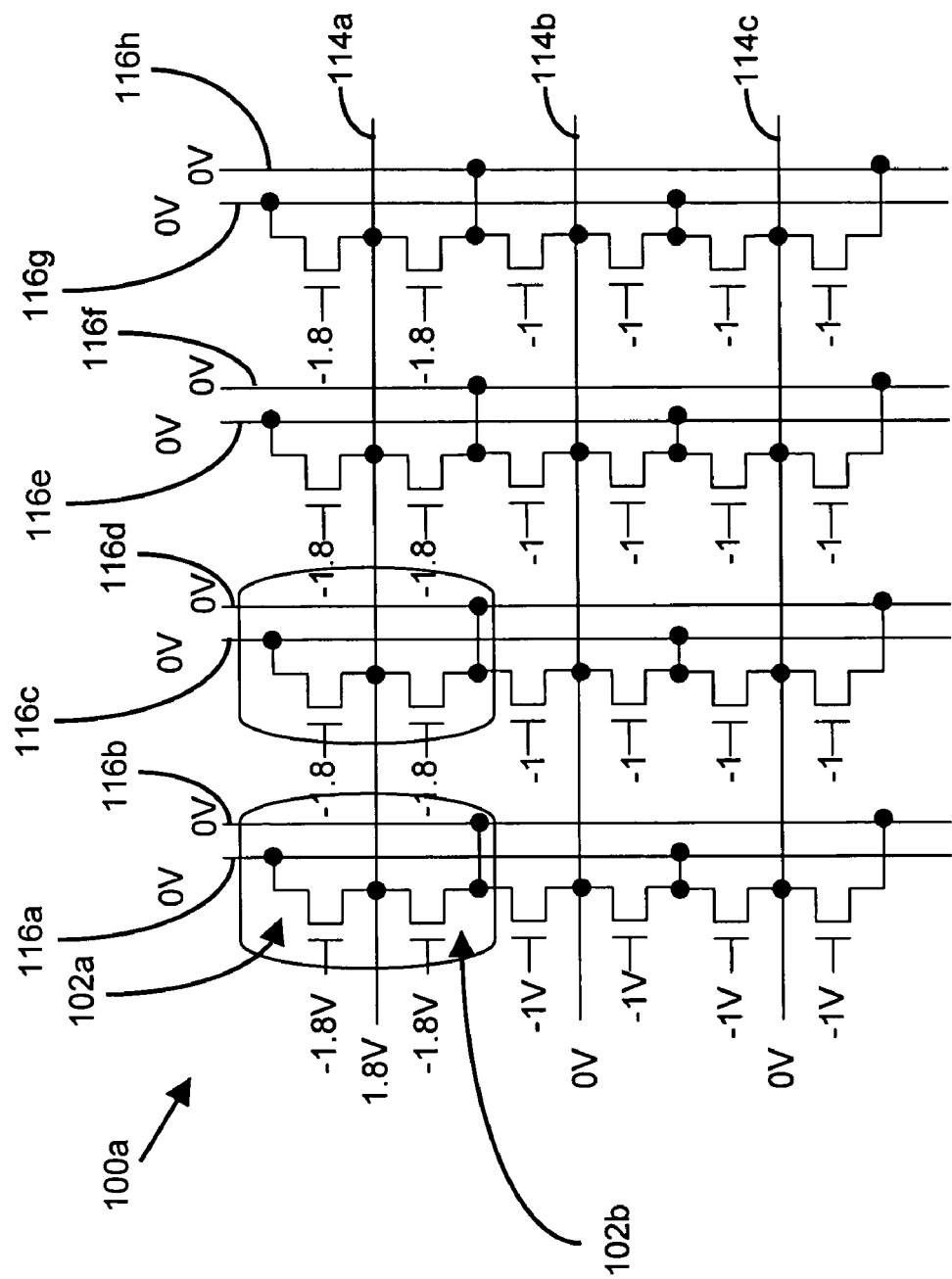
FIGS. 21 and 22 illustrate a memory array including a plurality of memory cells having a common source line array that define a particular row of memory cells, and exemplary writing and/or programming techniques (including exemplary programming voltage values), according to another aspect of the present invention.
Figure 22:
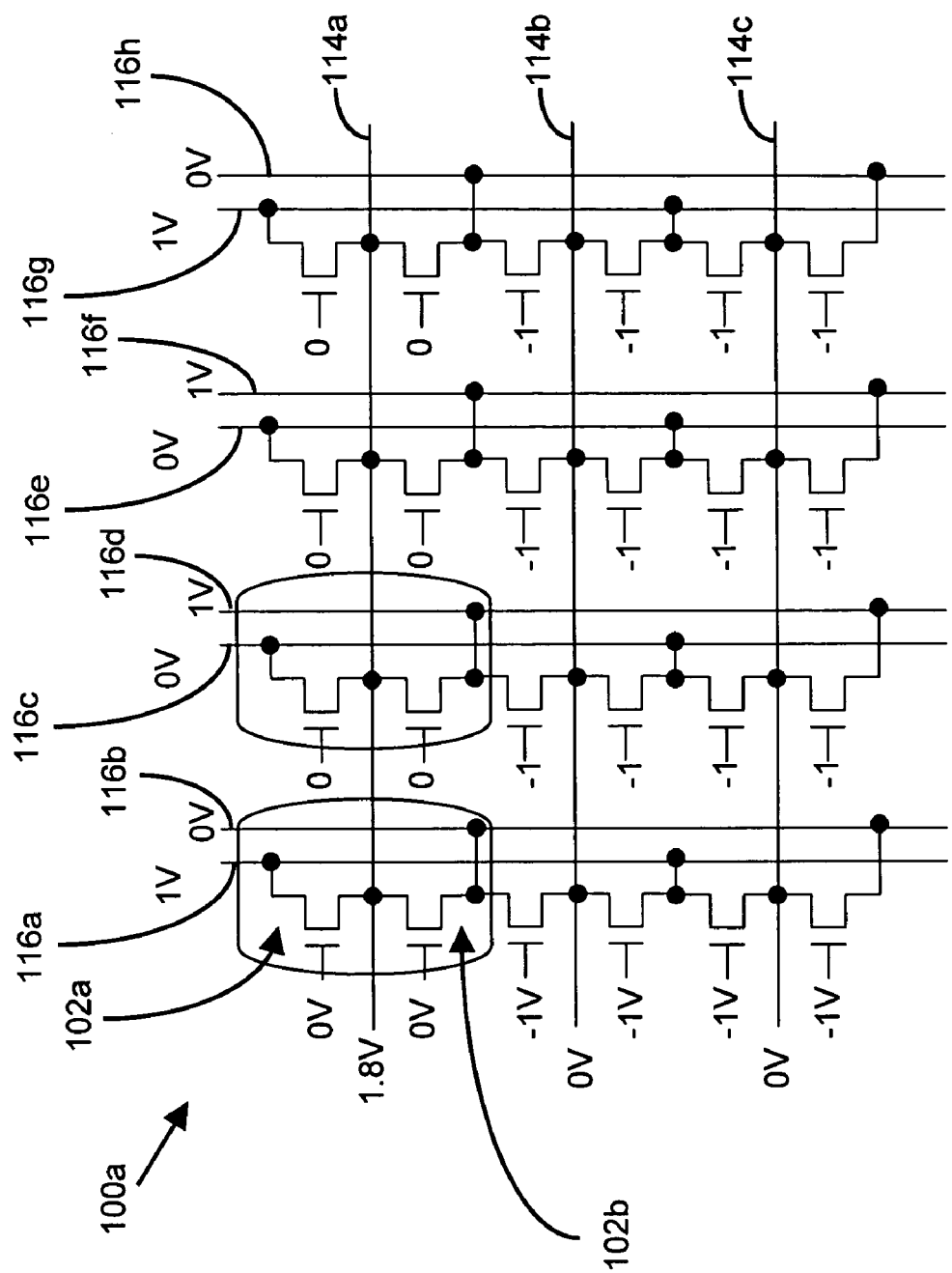
Figure 23:
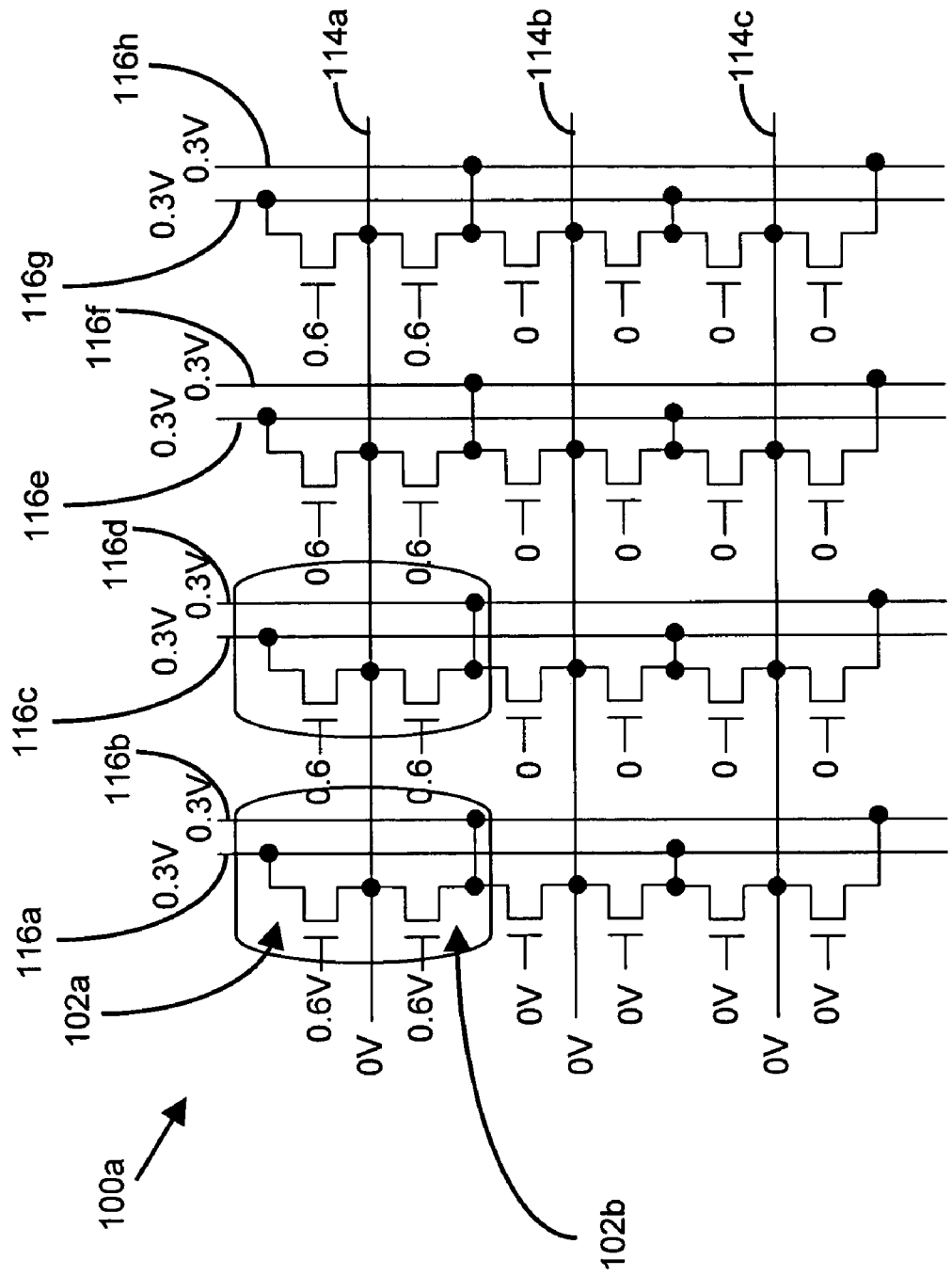
FIG. 23 illustrates exemplary read operation voltage values, according to an embodiment of the present invention, for a memory array of FIGS. 21 and 22.
Figure 24:
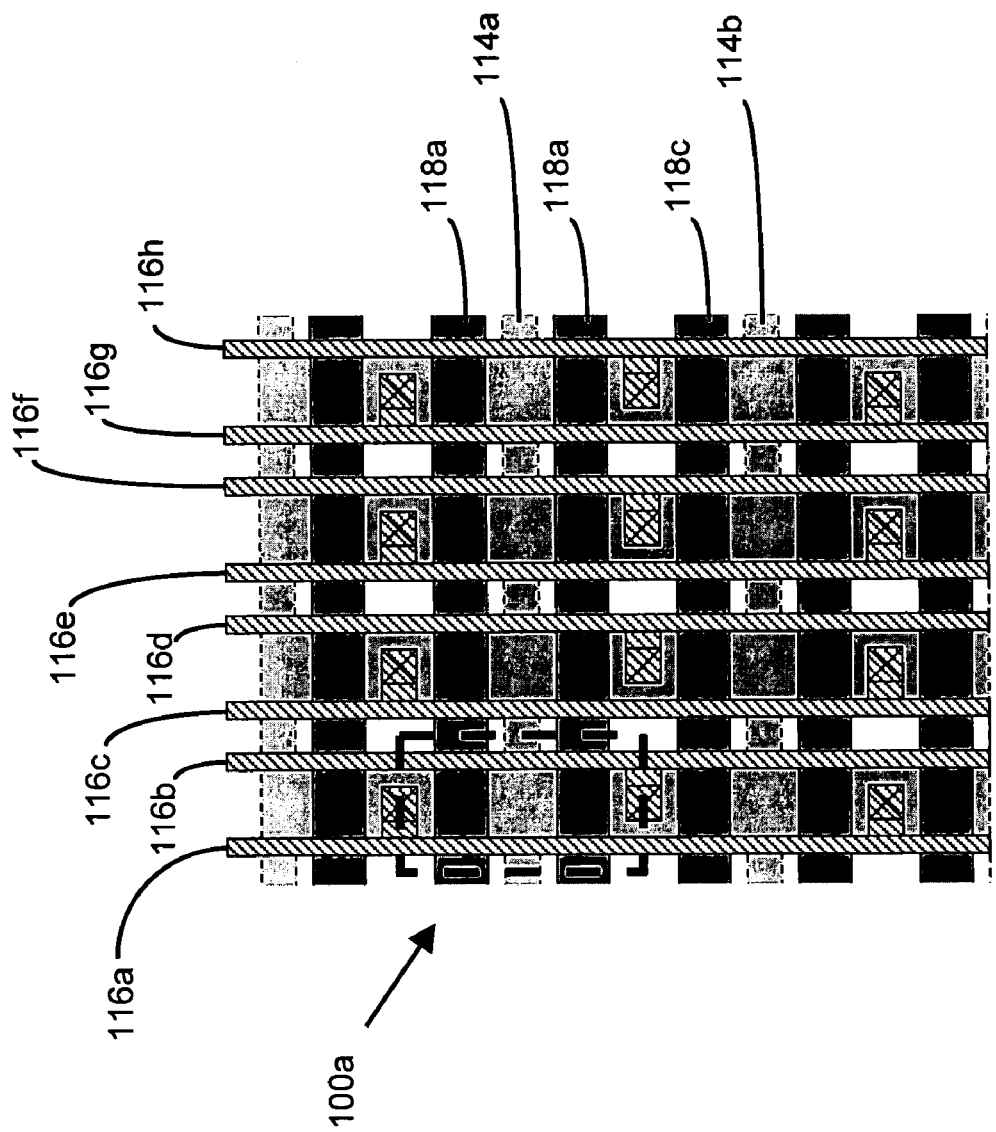
FIG. 24 illustrates an exemplary layout of the memory array of FIGS. 21 and 22.

With reference to FIGS. 19A and 19B, the data may be read from memory cells 100 of row 120 by applying the exemplary voltages indicated. Notably, the exemplary read voltages of FIG. 19B may avoid, reduce and/or minimize the need for charge pumping to eliminate minority carriers from the floating body-gate interface.

Another memory array architectures that may employ the two-step write technique that eliminates, minimizes and/or reduces disturbance to memory cells when reading from and/or writing to adjacent memory cells is illustrated in FIGS. 21–24. In this architecture, the source lines are shared but bit lines are separated. The transistors 102a and 102b of memory cell 100a are located on separate rows. The gates of transistors 102a and 102b are connected together at the array boundary.

Notably, transistors 102a and 102b of memory cell 100a are located on separate rows with the gates of each transistor 102a and 102b connected at, for example, the array boundary. In this embodiment, there is a separate bit line (here, drain lines 116a and 116b) for each transistor 102a and 102b of memory cell 100a so that each transistor 102a and 102b may be read separately using, for example, comparator 104 (not illustrated in FIG. 23).

FIGS. 25–28 illustrate another memory array architecture in which a plurality of memory cells "share" a source line and employ the two-step write technique that may eliminate, minimize and/or reduce disturbance to memory cells when reading from and/or writing to adjacent memory cells. In this regard, with reference to FIGS. 25 and 26, in one embodiment, a given row may be written to by applying suitable voltages to implement a clear operation followed by a selective write operation. In conjunction with applying suitable voltages to implement the clear operation, a write inhibit signal is applied to the gates of memory cells that share a source line 114 (for example, a write inhibit signal may be applied to the gates of transistors that comprise memory cell 100x and memory cell 100y).

Figure 25:
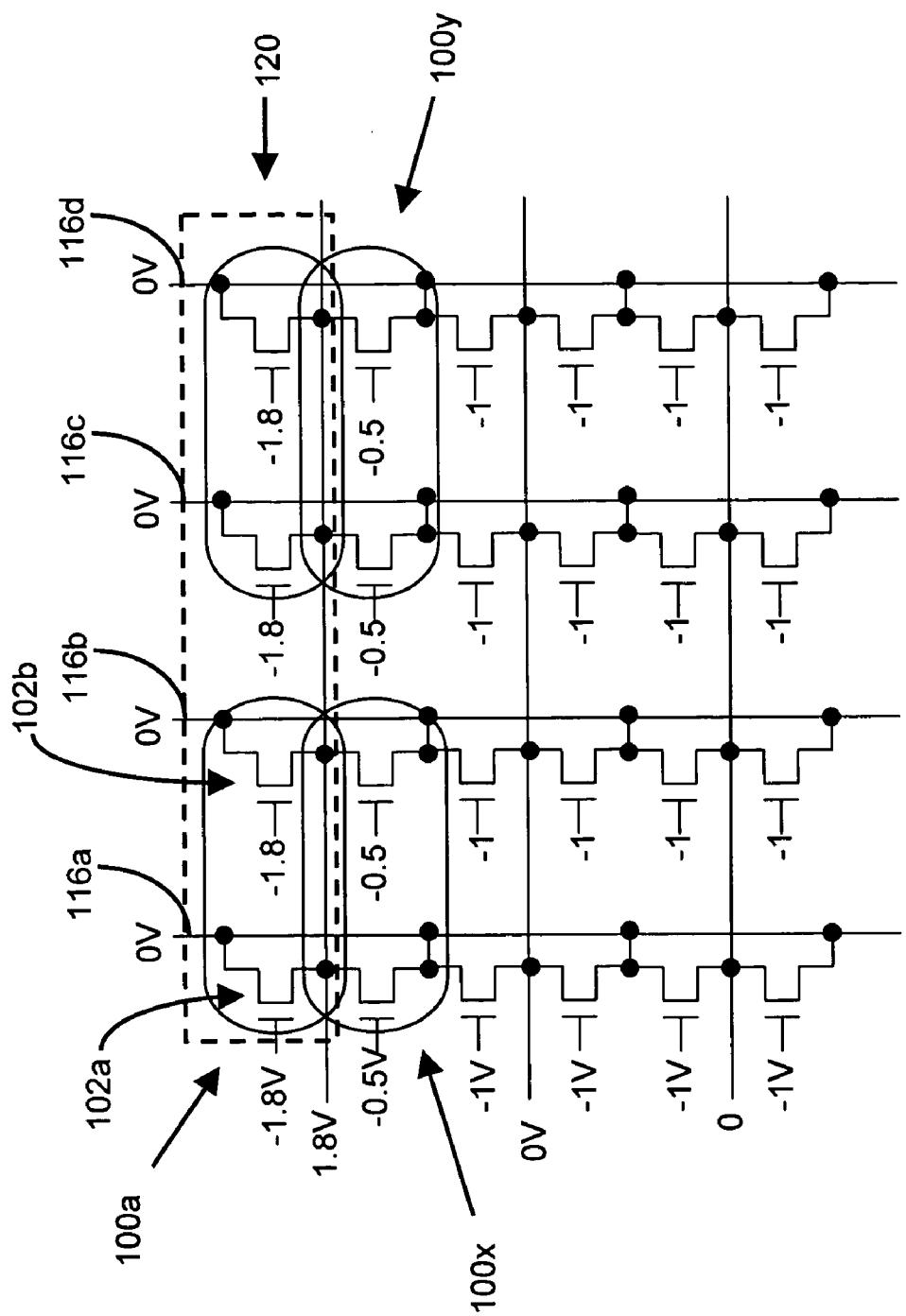
FIGS. 25 and 26 illustrate another memory array architecture including a plurality of memory cells having a common source line array, and exemplary writing and/or programming techniques (including exemplary programming voltage values), according to another aspect of the present invention.
Figure 26:
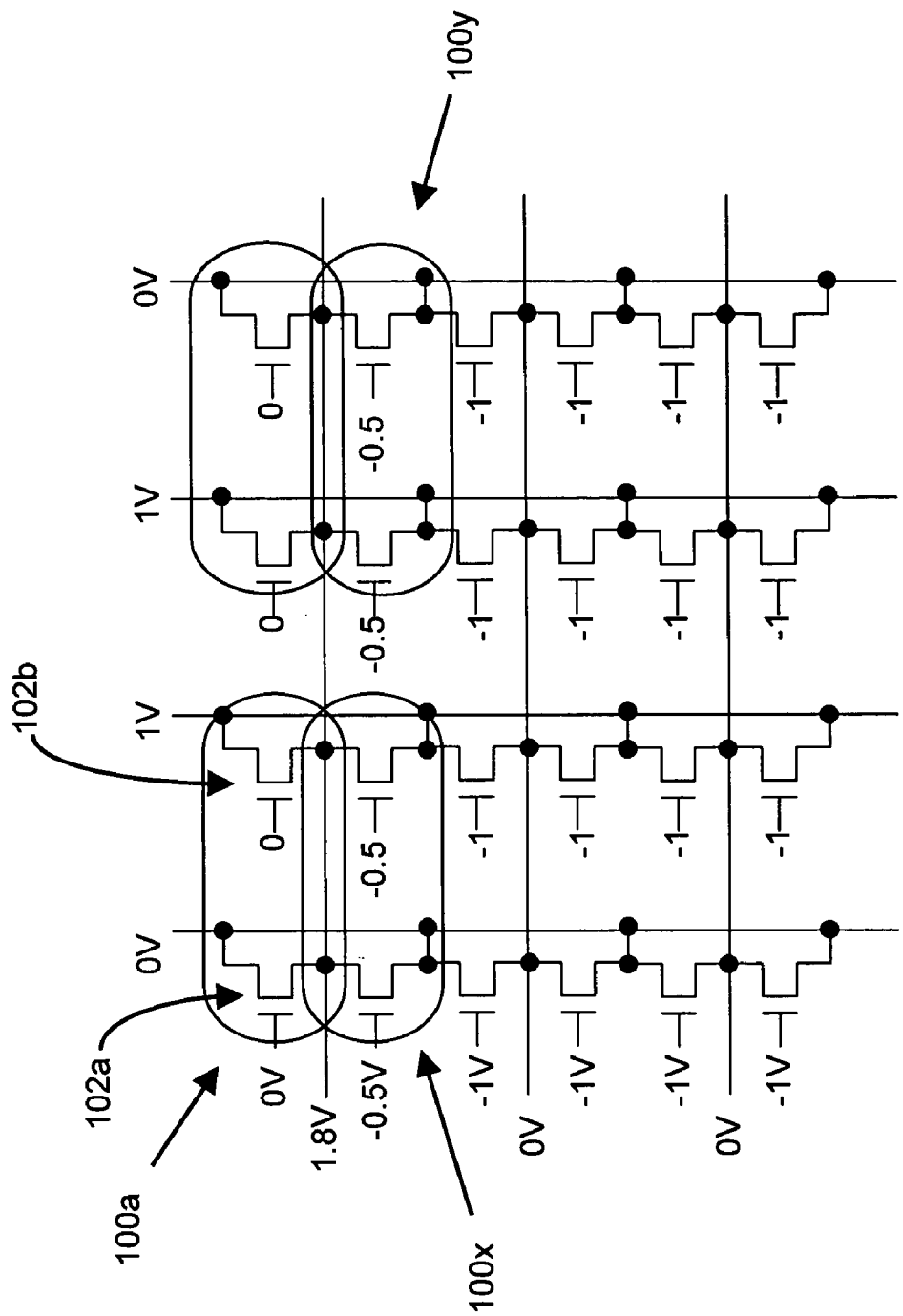

In particular, exemplary voltages that implement a clear operation for row 120 and maintain the neighboring memory cells (for example, memory cells 100x and 100y) remaining portion of the array in a fixed state (i.e., unchanged in response to the clear operation) are indicated in FIG. 25. The individual transistors 102 of the memory cells 100 of row 120 are written to a particular, desired and/or predetermined logic state (see, for example, FIG. 26 (write "1") in memory cell 100a) in order to store a particular, desired and/or predetermined logic state of the memory cell 100. That is, as described above, one of the transistors of memory cell 100 is written to logic low (binary "0") to write either a logic high or logic low into the memory cell 100.

Figure 27:
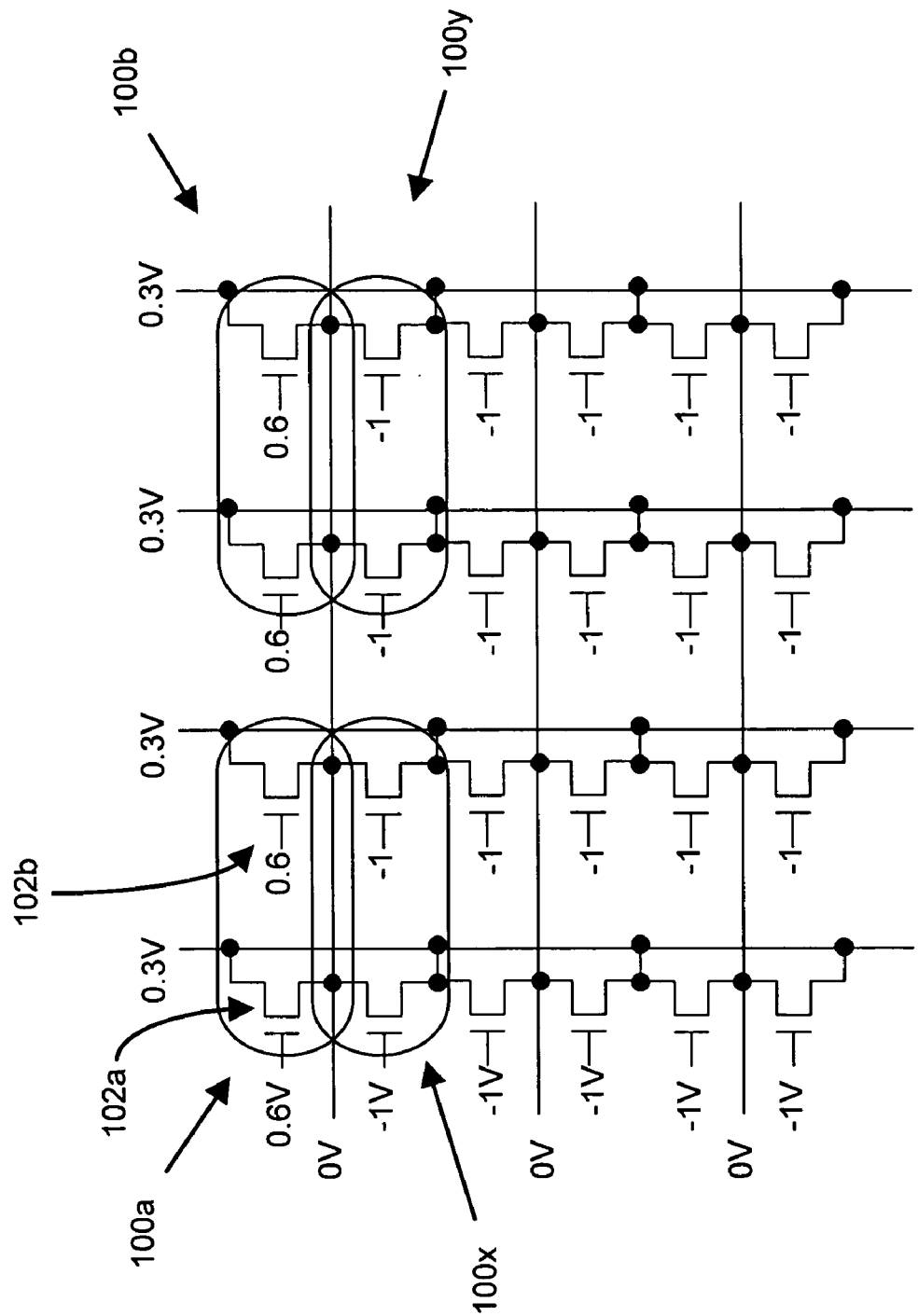
FIG. 27 illustrates exemplary read operation voltage values, according to an embodiment of the present invention, for a memory array of FIGS. 25 and 26.
Figure 28:
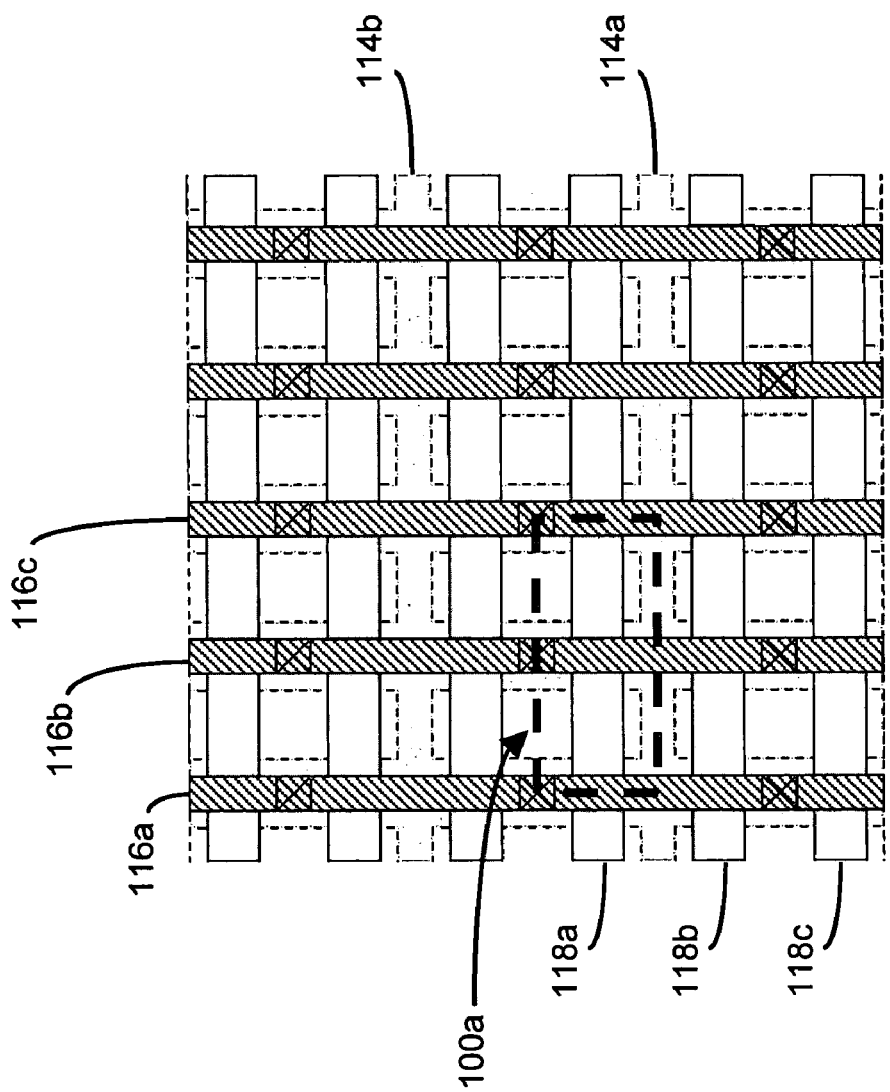
FIG. 28 illustrates an exemplary layout of the memory array of FIGS. 25 and 26.

With reference to FIG. 27, the data may be read from memory cells 100 of row 120 by applying the exemplary voltages indicated. Notably, an exemplary read inhibit voltage for the remaining portion of the array (including the neighboring memory cells) is also indicated. The read inhibit voltage/signal maintains the unselected portion of the array in a fixed state (i.e., unchanged in response to the read operation).

Figure 29:
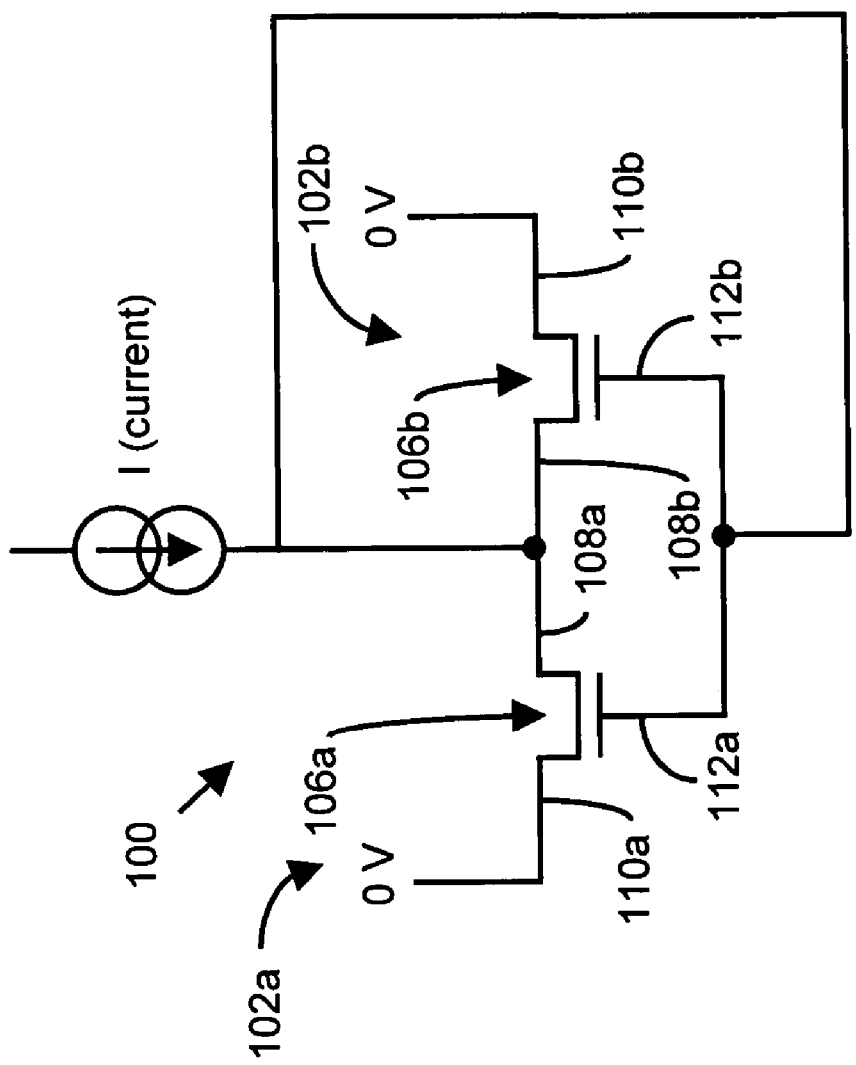
FIGS. 29 and 30 illustrate a refresh architecture and technique for the memory cell and memory cell array according to one embodiment of the present invention.
Figure 30:
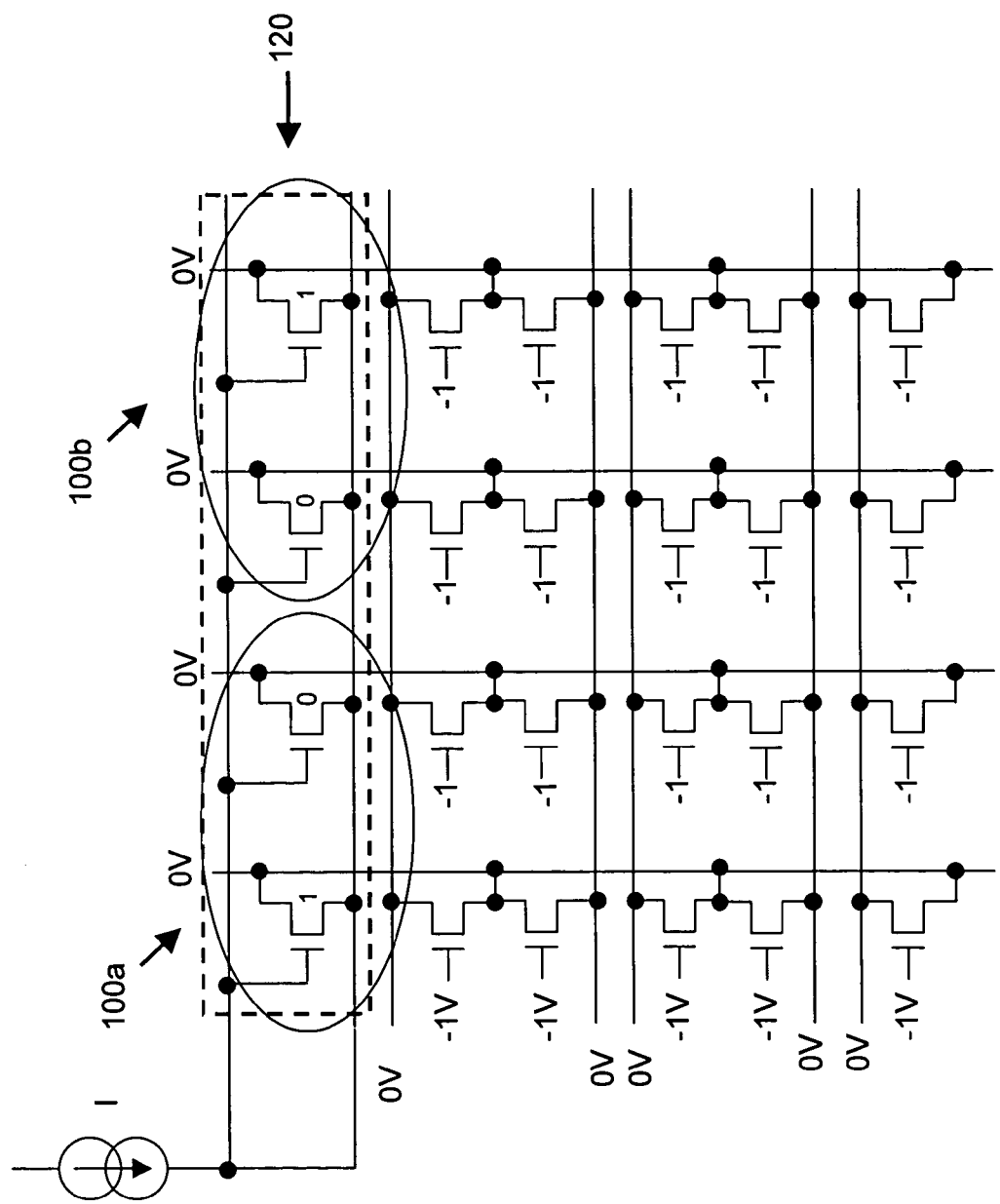

The memory cell 100 is a dynamic storage device. As such, memory cell 100 must be periodically or intermittently refreshed to maintain its data state. FIGS. 29 and 30 illustrate an exemplary (and inventive) refresh configuration and technique for refreshing and/or re-storing the data state of memory cell 100. In one embodiment, gates 112a and 112b and source regions 108a and 108b of transistors 102a and 102b (respectively) of memory cell 100 are connected and thereafter a current (I) is applied on the electrically shorted gates and sources. The drain regions 110a and 110b of transistors 102a and 102b (respectively) are maintained at a predetermined voltage (for example, 0V).

With reference to FIG. 29, in operation, because transistors 102a and 102b of memory cell 100 have different thresholds depending on which transistor is storing logic low and which transistor is storing a logic high, the forced current (I) will pass mainly through the transistor having the lower threshold (i.e., the transistor storing a logic high (binary "1")). With a small forced current, the transistor currents will differ by orders of magnitude. The higher current through the low threshold transistor will inject holes into the body of that transistor and, as such, will reinforce the logic high (binary "1"). The high threshold transistor may have some hole injection but not enough to overcome the natural tendency to return to the neutral state.

Notably, the current (I) may also be applied to the electrically shorted gates and drains with the sources maintained at a predetermined voltage (for example, 0V).

FIG. 30 illustrates the refresh technique in the context of a memory array wherein row 120 of memory cells 100 are refreshed. When refreshing an entire row, the forced current flows almost exclusively through all the transistors storing a logic high (binary "1"). It should be noted that this refresh technique is well suited to the memory cells and memory array architecture of the present inventions because the optimum range of forced current is independent of the data stored in the refreshed row (that is, half the transistors contain a logic high and the other half contain a logic low).

Notably, although FIG. 30 illustrates a "separated source" array architecture, the technique is also applicable to the other array architectures described herein. For the sake of brevity, the discussion regarding refresh will not be repeated for such other array architectures.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

For example, as mentioned above, the illustrated voltage levels to implement the write and read operations are exemplary. The indicated voltage levels may be relative or absolute. That is, for example, a logic low may be written into transistor 102a (see, for example, FIG. 7A) or transistor 102b (see, for example, FIG. 7B) using the voltages indicated therein. Alternatively, the voltages indicated may be relative in that each voltage level, for example, may be increased or decreased by a given voltage amount (for example, each voltage may be increased by 0.5 volts).

As mentioned above, the entire contents of the Semiconductor Memory Device Patent Application, including, for example, the features, attributes, architectures, configurations, materials, techniques and advantages described and illustrated therein, are incorporated by reference herein.

While a significant portion of this description includes details (for example, clear, write, read and inhibit voltages) directed to N-channel transistors, the inventions (and embodiments thereof described herein are entirely applicable to P-channel transistors. In such embodiments, majority carriers in body region 18 are electrons and minority carriers are holes. Indeed, the memory arrays may be comprised of N-channel, P-channel and/or both types of transistors. Moreover, the circuitry that is peripheral to the memory array (for example, row and column address decoders, not illustrated herein) may include P-channel and/or N-channel type transistors, including transistors like transistor 14.

Notably, where P-channel type transistors are employed as memory cells 12 in the memory array(s), suitable clear, write, read and inhibit voltages are well known to those skilled in the art in light of this disclosure. Accordingly, for sake of brevity, these discussions will not be repeated.

Further, memory cell(s) 102 (as well as memory array and matrices 40a–n) may also employ the structure, features, attributes, architectures, configurations, materials, techniques and advantages described and illustrated in non-provisional patent application entitled "Semiconductor Device", which was filed on Feb. 18, 2004, by Fazan and Okhonin, and assigned Ser. No. 10/487,157 (hereinafter "Semiconductor Device Patent Application"). The entire contents of the Semiconductor Device Patent Application, including, for example, the inventions, features, attributes, architectures, configurations, materials, techniques and advantages described and illustrated therein, are hereby incorporated by reference herein.

What is claimed is:

1. A semiconductor dynamic random access memory cell for storing a first data state and a second data state, the memory cell comprising:

first and second transistors, wherein each transistor includes:

a source region;

a drain region;

a body region disposed between the source region and the drain region, wherein the body region is electrically floating; and a gate spaced apart from, and capacitively coupled to, the body region;

wherein each transistor includes (i) a first state representative of a first charge in the body region, and (ii) a second state representative of a second charge in the body region;

wherein the memory cell is in: (1) the first data state when the first transistor is in the first state and the second transistor is in the second state, and (2) the second data state when the first transistor is in the second state and the second transistor is in the first state; and wherein the memory cell is programmed to a first data state by applying (i) a first control signal to the gate of the first transistor and a second control signal to the drain of the first transistor and (ii) a third control signal to the gate of the second transistor and a fourth control signal to the drain of the second transistor wherein:

the first and third control signals include different voltage amplitudes, and the second and fourth control signals include substantially the same voltage amplitudes.

2. The semiconductor dynamic random access memory cell of claim 1 wherein the memory cell includes two outputs including a first output connected to the drain region of the first transistor and a second output connected to the drain region of the second transistor.

3. The semiconductor dynamic random access memory cell of claim 2 wherein the gate of the first transistor is connected to the gate of the second transistor.

4. The semiconductor dynamic random access memory cell of claim 3 wherein the source region of the first transistor and the source region of the second transistor are the same region.

5. The semiconductor dynamic random access memory cell of claim 1 wherein the memory cell is programmed to a first data state by applying a fifth control signal to the source of the first transistor and a sixth control signal to the source of the second transistors, and wherein the fifth and sixth control signals include substantially the same voltage amplitudes.

6. The semiconductor dynamic random access memory cell of claim 1 wherein the memory cell includes two outputs including a first output connected to the source region of the first transistor and a second output connected to the source region of the second transistor.

7. The semiconductor dynamic random access memory cell of claim 6 wherein the drain region of the first transistor and the drain region of the second transistor are the same region.

8. A semiconductor memory array, comprising:

a plurality of semiconductor dynamic random access memory cells arranged in a matrix of rows and columns, each semiconductor dynamic random access memory cell includes:

first and second transistors, wherein each transistor includes:

a source region;

a drain region;

a body region disposed between the source region and the drain region, wherein the body region is electrically floating: and a gate spaced apart from, and capacitively coupled to, the body region;

wherein each transistor includes (i) a first state representative of a first charge in the body region, and (ii) a second state representative of a second charge in the body region;

wherein each memory cell is in: (1) the first data state when its first transistor is in the first state and its second transistor is in the second state, and (2) the second data state when its first transistor is in the second state and its second transistor is in the first state; and wherein each memory cell is programmed to a first data state by applying (i) a first control signal to the gate of the first transistor and a second control signal to the drain of the first transistor and (ii) a third control signal to the gate of the second transistor and a fourth control signal to the drain of the second transistor wherein:

the first and third control signals include different voltage amplitudes, and the second and fourth control signals include substantially the same voltage amplitudes.

9. The semiconductor memory array of claim 8 further including a comparator having a plurality of inputs to sense the states of the first and second transistors of a semiconductor dynamic random access memory cell of the plurality of semiconductor dynamic random access memory cells, wherein a first input of the comparator is selectively coupled to a first transistor of the semiconductor dynamic random access memory cell and a second input of the comparator is selectively coupled to the second transistor of a semiconductor dynamic random access memory cell.

10. The semiconductor memory array of claim 8 wherein at least one of the rows of semiconductor dynamic random access memory cells includes a source line that is connected to each of the semiconductor dynamic random access memory cells of the row.

11. The semiconductor memory array of claim 8 wherein each row of semiconductor dynamic random access memory cells includes an associated source line which is connected to only the semiconductor dynamic random access memory cells of the associated row.

12. The semiconductor memory array of claim 8 further including:

a comparator having a plurality of inputs to sense the data state of a semiconductor dynamic random access memory cell of the plurality of semiconductor dynamic random access memory cells, wherein a first input of the comparator is selectively coupled to the drain region of the first transistor of the semiconductor dynamic random access memory cell and a second input of the comparator is selectively coupled to the drain of second first transistor of a semiconductor dynamic random access memory cell; and wherein each row of semiconductor dynamic random access memory cells includes an associated source line which is connected to only the semiconductor dynamic random access memory cells of the row.

13. The semiconductor memory array of claim 8 wherein at least one semiconductor dynamic random access memory cell is programmed in a first data state by performing a clear operation of the first and second transistors of the semiconductor dynamic random access memory cell and then performing a write operation wherein, in response, the first transistor of the semiconductor dynamic random access memory cell is in a first state and the second transistor of the semiconductor dynamic random access memory cell is in a second state.

14. The semiconductor memory array of claim 8 wherein at least one semiconductor dynamic random access memory cell is programmed in a first data state by first placing the first and second transistors of the semiconductor dynamic random access memory cell in a first state and thereafter placing the second transistor of the semiconductor dynamic random access memory cell is in a second state.

15. The semiconductor memory array of claim 14 wherein an unselected portion of the semiconductor memory array is maintained in a fixed state when programming the at least one semiconductor dynamic random access memory cell by applying a write inhibit signal to the transistors of the semiconductor dynamic random access memory cells comprising the unselected portion of the semiconductor memory array.

16. The semiconductor memory array of claim 8 wherein each semiconductor dynamic random access memory cell includes two outputs including a first output connected to the drain region of the first transistor and a second output connected to the drain region of the second transistor.

17. The semiconductor memory array of claim 8 wherein the source region of the first transistor and the source region of the second transistor of each semiconductor dynamic random access memory cell are the same region.

18. The semiconductor memory array of claim 8 wherein the source region of the first transistor and the source region of the second transistor of each semiconductor dynamic random access memory cell are connected to different source lines.

19. The semiconductor memory array of claim 8 wherein each semiconductor dynamic random access memory cell includes two outputs including a first output connected to the source region of the first transistor and a second output connected to the source region of the second transistor.

20. The semiconductor memory array of claim 19 wherein the drain region of the first transistor and the drain region of the second transistor of each semiconductor dynamic random access memory cell are the same region.

21. A semiconductor dynamic random access memory cell for storing a first data state and a second data state, the memory cell comprising:
  first and second transistors, wherein each transistor includes:
    a source region;
    a drain region;
    a body region disposed between the source region and the drain region, wherein the body region is electrically floating; and
    a gate spaced apart from, and capacitively coupled to, the body region;
  wherein each transistor includes (i) a first state representative of a first charge in the body region, and (ii) a second state representative of a second charge in the body region;
  wherein the memory cell is in: (1) the first data state when the first transistor is in the first state and the second transistor is in the second state, and (2) the second data state when the first transistor is in the second state and the second transistor is in the first state; and
  wherein the memory cell is programmed to a first data state by applying (i) a first control signal to the gate of the first transistor and a second control signal to the drain of the first transistor and (ii) a third control signal to the gate of the second transistor and a fourth control signal to the drain of the second transistor wherein:
    the first and third control signals include substantially the same voltage amplitudes, and
    the second and fourth control signals include different voltage amplitudes.

22. The semiconductor dynamic random access memory cell of claim 21 wherein the memory cell includes two outputs including a first output connected to the drain region of the first transistor and a second output connected to the drain region of the second transistor.

23. The semiconductor dynamic random access memory cell of claim 22 wherein the gate of the first transistor is connected to the gate of the second transistor.

24. The semiconductor dynamic random access memory cell of claim 23 wherein the source region of the first transistor and the source region of the second transistor are the same region.

25. The semiconductor dynamic random access memory cell of claim 23 wherein the memory cell is programmed to a first data state by applying a fifth control signal to the source of the first transistor and a sixth control signal to the source of the second transistor, and wherein the fifth and sixth control signals include substantially the same voltage amplitudes.

26. The semiconductor dynamic random access memory cell of claim 23 wherein the memory cell includes two outputs including a first output connected to the source region of the first transistor and a second output connected to the source region of the second transistor.

27. The semiconductor dynamic random access memory cell of claim 26 wherein the drain region of the first transistor and the drain region of the second transistor are the same region.

28. A semiconductor memory array, comprising:
  a plurality of semiconductor dynamic random access memory cells arranged in a matrix of rows and columns, each semiconductor dynamic random access memory cell includes:
    first and second transistors, wherein each transistor includes:
      a source region;
      a drain region;
      a body region disposed between the source region and the drain region, wherein the body region is electrically floating; and
      a gate spaced apart from, and capacitively coupled to, the body region;
      wherein each transistor includes (i) a first state representative of a first charge in the body region, and (ii) a second state representative of a second charge in the body region; and
    wherein each memory cell is in: (1) the first data state when its first transistor is in the first state and its second transistor is in the second state, and (2) the second data state when its first transistor is in the second state and its second transistor is in the first state; and
    wherein each memory cell is programmed to a first data state by applying (i) a first control signal to the gate of the first transistor and a second control signal to the drain of the first transistor and (ii) a third control signal to the gate of the second transistor and a fourth control signal to the drain of the second transistor wherein:
      the first and third control signals include substantially the same voltage amplitudes, and
      the second and fourth control signals include different voltage amplitudes.

29. The semiconductor memory array of claim 28 further including a comparator having a plurality of inputs to sense the states of the first and second transistors of a semiconductor dynamic random access memory cell of the plurality of semiconductor dynamic random access, memory cells, wherein a first input of the comparator is selectively coupled to a first transistor of the semiconductor dynamic random access memory cell and a second input of the comparator is selectively coupled to the second transistor of a semiconductor dynamic random access memory cell.

30. The semiconductor memory array of claim 28 wherein at least one of the rows of semiconductor dynamic random access memory cells includes a source line that is connected to each of the semiconductor dynamic random access memory cells of the row.

31. The semiconductor memory array of claim 28 wherein each row of semiconductor dynamic random access memory cells includes an associated source line which is connected to only the semiconductor dynamic random access memory cells of the associated row.

32. The semiconductor memory array of claim 28 further including:
    a comparator having a plurality of inputs to sense the data state of a semiconductor dynamic random access memory cell of the plurality of semiconductor dynamic random access memory cells, wherein a first input of the comparator is selectively coupled to the drain region of the first transistor of the semiconductor dynamic random access memory cell and a second input of the comparator is selectively coupled to the drain of second first transistor of a semiconductor dynamic random access memory cell; and
    wherein each row of semiconductor dynamic random access memory cells includes an associated source line which is connected to only the semiconductor dynamic random access memory cells of the row.

33. The semiconductor memory array of claim 28 wherein at least one semiconductor dynamic random access memory cell is programmed in a first data state by performing a clear operation of the first and second transistors of the semiconductor dynamic random access memory cell and then performing a write operation wherein, in response, the first transistor of the semiconductor dynamic random access memory cell is in a first state and the second transistor of the semiconductor dynamic random access memory cell is in a second state.

34. The semiconductor memory array of claim 28 wherein at least one semiconductor dynamic random access memory cell is programmed in a first data state by first placing the first and second transistors of the semiconductor dynamic random access memory cell in a first state and thereafter placing the second transistor of the semiconductor dynamic random access memory cell is in a second state.

35. The semiconductor memory array of claim 34 wherein an unselected portion of the semiconductor memory array is maintained in a fixed state when programming the at least one semiconductor dynamic random access memory cell by applying a write inhibit signal to the transistors of the semiconductor dynamic random access memory cells comprising the unselected portion of the semiconductor memory array.

36. The semiconductor memory array of claim 28 wherein each semiconductor dynamic random access memory cell includes two outputs including a first output connected to the drain region of the first transistor and a second output connected to the drain region of the second transistor.

37. The semiconductor memory array of claim 28 wherein gate of the first transistor and the gate of the second transistor of each semiconductor dynamic random access memory cell are each connected to an associated common gate line.

38. The semiconductor memory array of claim 28 wherein the source region of the first transistor and the source region of the second transistor of each semiconductor dynamic random access memory cell are the same region.

39. The semiconductor memory array of claim 28 wherein the source region of the first transistor and the source region of the second transistor of each semiconductor dynamic random access memory cell are connected to different source lines.

40. The semiconductor memory array of claim 28 wherein each semiconductor dynamic random access memory cell includes two outputs including a first output connected to the source region of the first transistor and a second output connected to the source region of the second transistor.

41. The semiconductor memory array of claim 40 wherein the drain region of the first transistor and the drain region of the second transistor of each semiconductor dynamic random access memory cell are the same region.

* * * * *